United States Patent
Tsai et al.

(10) Patent No.: US 12,369,354 B2
(45) Date of Patent: Jul. 22, 2025

(54) THIN FILM TRANSISTOR INCLUDING A COMPOSITIONALLY- GRADED GATE DIELECTRIC AND METHODS FOR FORMING THE SAME

(71) Applicant: Taiwan Semiconductor Manufacturing Company Limited, Hsinchu (TW)

(72) Inventors: Wu-Wei Tsai, Hsinchu (TW); Chun-Chieh Lu, Taipei (TW); Hai-Ching Chen, Hsinchu (TW); Yu-Ming Lin, Hsinchu (TW); Sai-Hooi Yeong, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 47 days.

(21) Appl. No.: 18/359,015

(22) Filed: Jul. 26, 2023

(65) Prior Publication Data
US 2023/0369439 A1    Nov. 16, 2023

Related U.S. Application Data

(62) Division of application No. 17/467,497, filed on Sep. 7, 2021, now Pat. No. 12,113,115.

(Continued)

(51) Int. Cl.
*H10D 30/67* (2025.01)
*H01L 21/02* (2006.01)
(Continued)

(52) U.S. Cl.
CPC ... *H10D 30/6739* (2025.01); *H01L 21/02233* (2013.01); *H01L 21/02252* (2013.01);
(Continued)

(58) Field of Classification Search
CPC ............ H01L 29/4908; H01L 29/7869; H01L 21/02252; H01L 21/02233; H01L 21/02255; H01L 21/02565
See application file for complete search history.

(56) References Cited

U.S. PATENT DOCUMENTS 6,521,912 B1 *   2/2003   Sakama .............. H01L 29/6675
                                              257/E21.414
9,159,837 B2 *  10/2015   Yamazaki ......... H01L 29/42384
(Continued)

FOREIGN PATENT DOCUMENTS

JP    2013211543 A    10/2013
JP    2016100522 A     5/2016
(Continued)

OTHER PUBLICATIONS

Taiwan Patent and Trademark Office, Application No. 111100528 Office Action mailed May 19, 2023, 8 pages.
(Continued)

*Primary Examiner* — Vincent Wall
(74) *Attorney, Agent, or Firm* — The Marbury Law Group, PLLC

(57) ABSTRACT

A thin film transistor may be manufactured by forming a gate electrode in an insulating layer over a substrate, forming a gate dielectric over the gate electrode and the insulating layer, forming an active layer over the gate electrode, and forming a source electrode and a drain electrode contacting a respective portion of a top surface of the active layer. A surface oxygen concentration may be increased in at least one of the gate dielectric and the active layer by introducing oxygen atoms into a surface region of a respective one of the gate dielectric and the active layer.

20 Claims, 31 Drawing Sheets

Related U.S. Application Data

(60) Provisional application No. 63/147,274, filed on Feb. 9, 2021.

(51) Int. Cl.
*H01L 21/443* (2006.01)
*H10D 62/80* (2025.01)
*H10D 99/00* (2025.01)

(52) U.S. Cl.
CPC .. *H01L 21/02255* (2013.01); *H01L 21/02565* (2013.01); *H01L 21/443* (2013.01); *H10D 30/6755* (2025.01); *H10D 62/80* (2025.01); *H10D 99/00* (2025.01)

(56) References Cited

U.S. PATENT DOCUMENTS

| | | | | |
|---|---|---|---|---|
| 9,472,679 | B2 * | 10/2016 | Yamazaki | H01L 29/7831 |
| 9,478,664 | B2 * | 10/2016 | Yamazaki | H01L 21/02565 |
| 2006/0284172 | A1 * | 12/2006 | Ishii | H01L 29/66969 |
| | | | | 257/43 |
| 2009/0261325 | A1 * | 10/2009 | Kawamura | H01L 29/7869 |
| | | | | 438/149 |
| 2010/0244049 | A1 * | 9/2010 | Yamamoto | H01L 29/6606 |
| | | | | 257/77 |
| 2013/0126861 | A1 * | 5/2013 | Tanaka | H01L 29/7869 |
| | | | | 257/E29.296 |
| 2013/0256655 | A1 * | 10/2013 | Wang | H01L 29/78693 |
| | | | | 257/43 |
| 2013/0270562 | A1 | 10/2013 | Yamazaki | |
| 2014/0225105 | A1 * | 8/2014 | Tanaka | H01L 29/7869 |
| | | | | 257/43 |
| 2015/0076652 | A1 * | 3/2015 | Jang | H01L 29/0615 |
| | | | | 257/487 |
| 2015/0187952 | A1 * | 7/2015 | Yamazaki | H01L 29/7869 |
| | | | | 257/43 |
| 2016/0155848 | A1 * | 6/2016 | Iwasaki | H01L 29/7869 |
| | | | | 257/43 |
| 2016/0276441 | A1 * | 9/2016 | Furukawa | H01L 29/0649 |
| 2016/0308067 | A1 * | 10/2016 | Shih | H01L 29/78696 |
| 2017/0236842 | A1 * | 8/2017 | Matsuda | H01L 27/1225 |
| | | | | 257/43 |
| 2019/0058043 | A1 | 2/2019 | Dewey et al. | |
| 2019/0074357 | A1 * | 3/2019 | Lai | H01L 29/518 |
| 2020/0211425 | A1 | 7/2020 | Yamazaki et al. | |
| 2021/0280718 | A1 * | 9/2021 | Matsubayashi | H01L 29/7869 |
| 2022/0254897 | A1 * | 8/2022 | Tsai | H01L 21/441 |

FOREIGN PATENT DOCUMENTS

| | | |
|---|---|---|
| KR | 100711000 B1 | 4/2007 |
| KR | 20080103572 A | 11/2008 |
| KR | 20170041433 A | 4/2017 |

OTHER PUBLICATIONS

Korean Patent and Trademark Office, KR Application No. 10-2022-0015123; Office Action mailed Sep. 20, 2024; 12 pages.

Korean Patent and Trademark Office, KR Application No. 10-2022-0015123, Office Action mailed Jan. 31, 2024 16 pages.

German Patent and Trademark Office, DE Application No. 10 2022 100 364.7; 1st Examination Report mailed Aug. 27, 2024; 16 pages.

KR Patent and Trademark Office; KR Application No. 10-2022-0015123; third Office Action mailed May 26, 2025; 8 pages.

\* cited by examiner

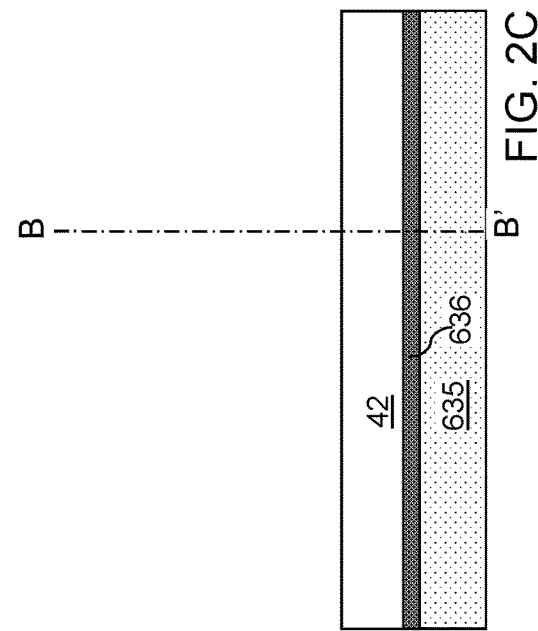
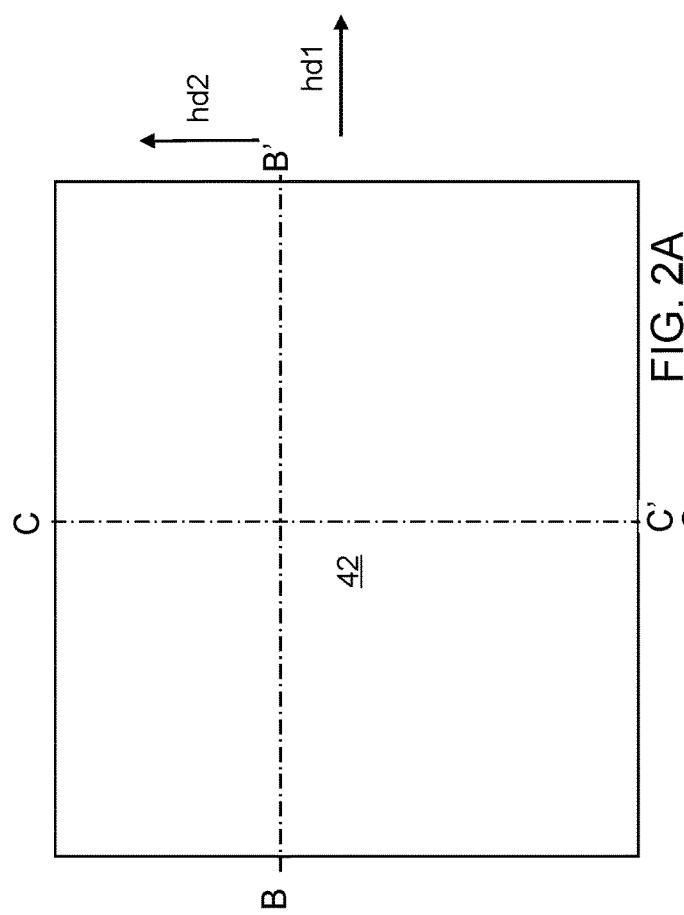
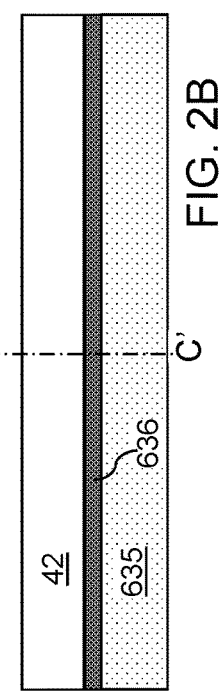

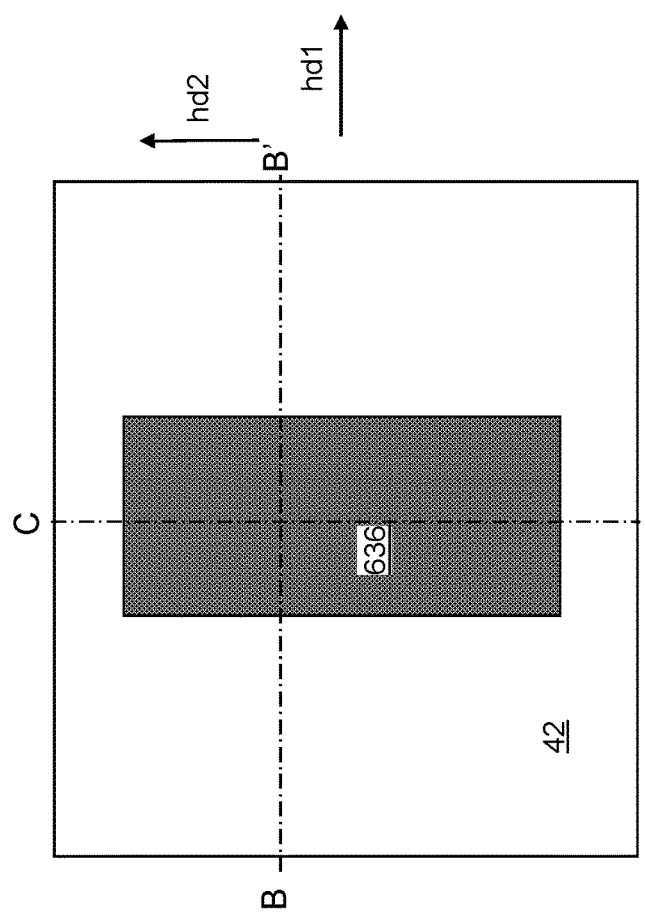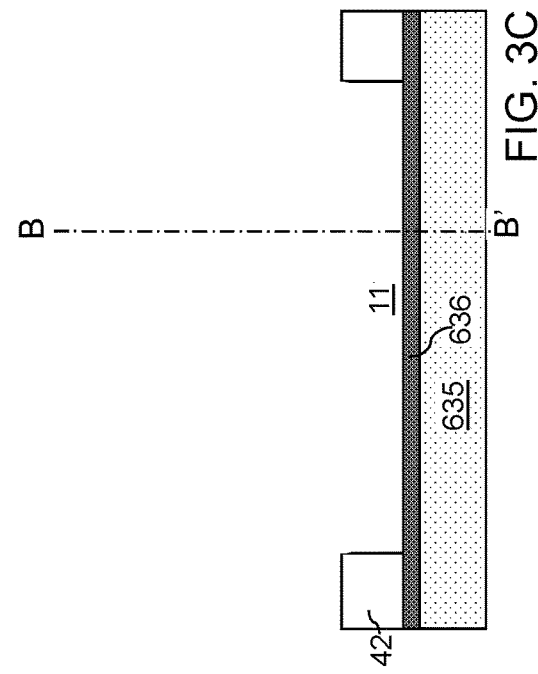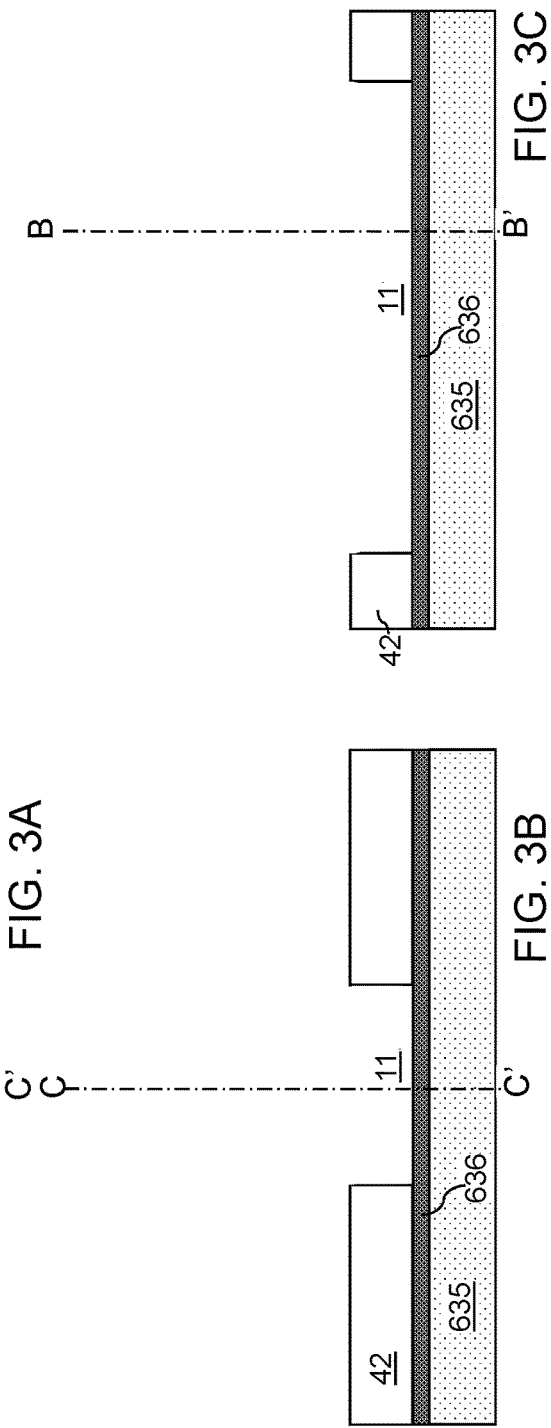

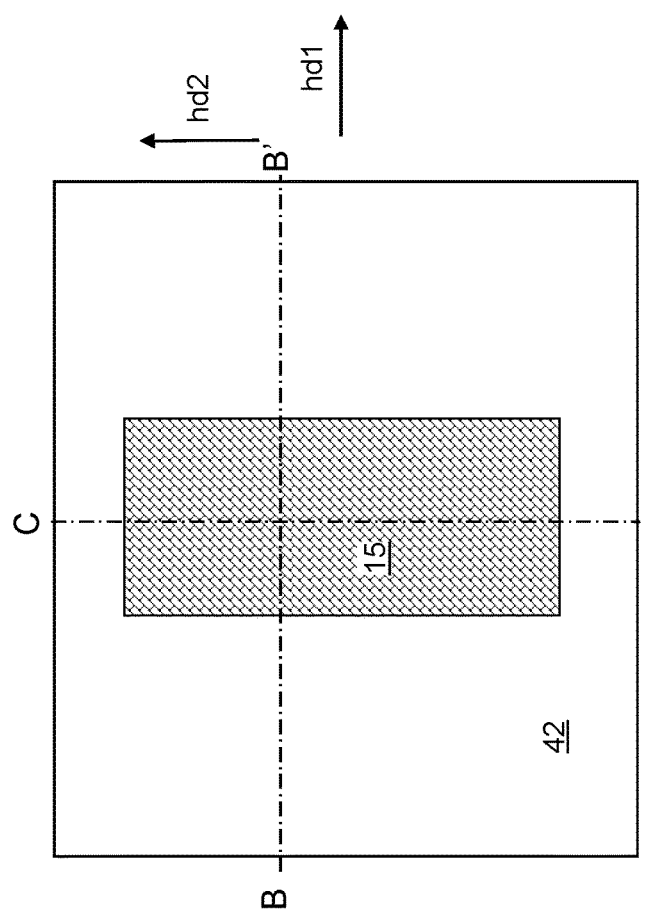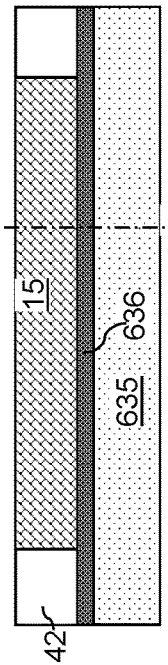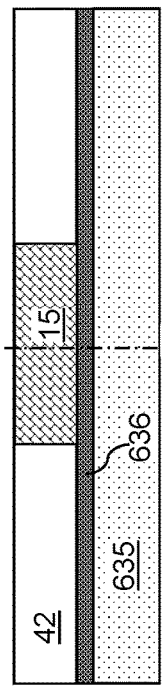

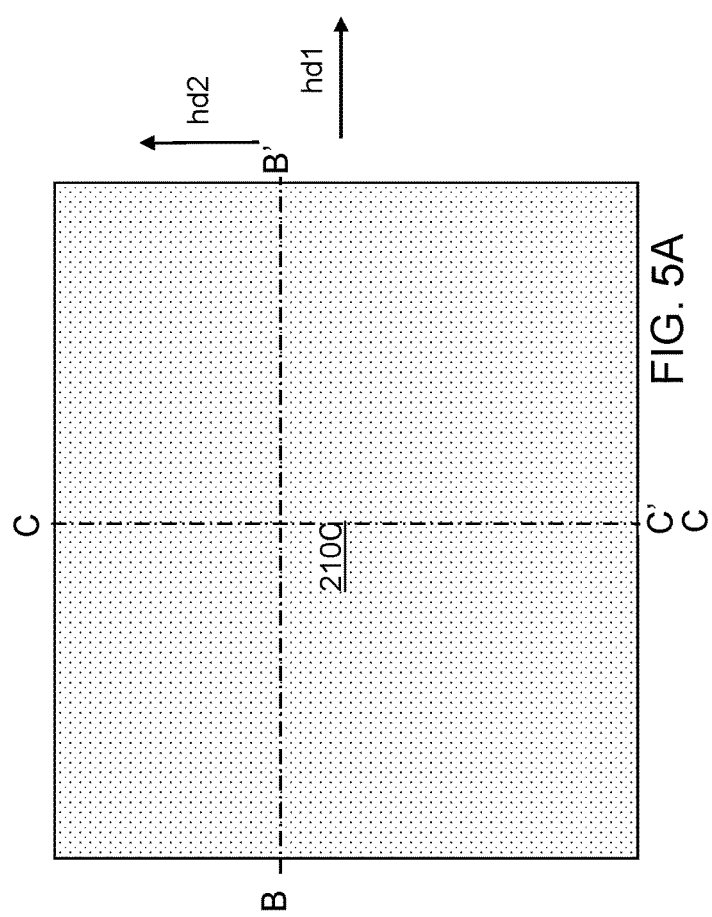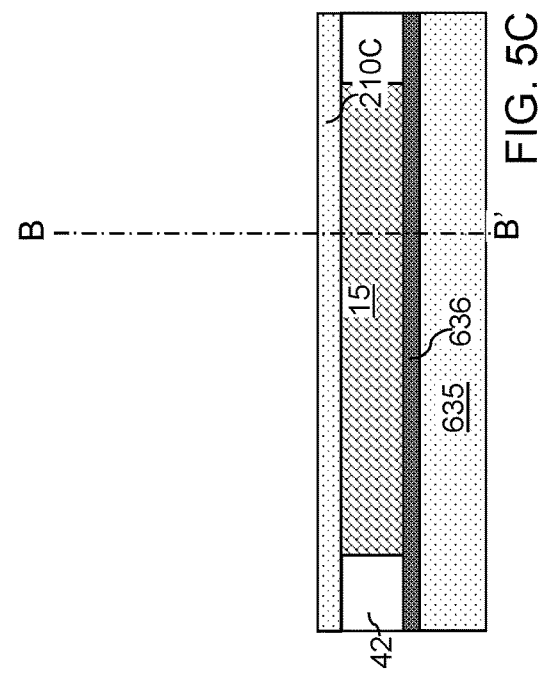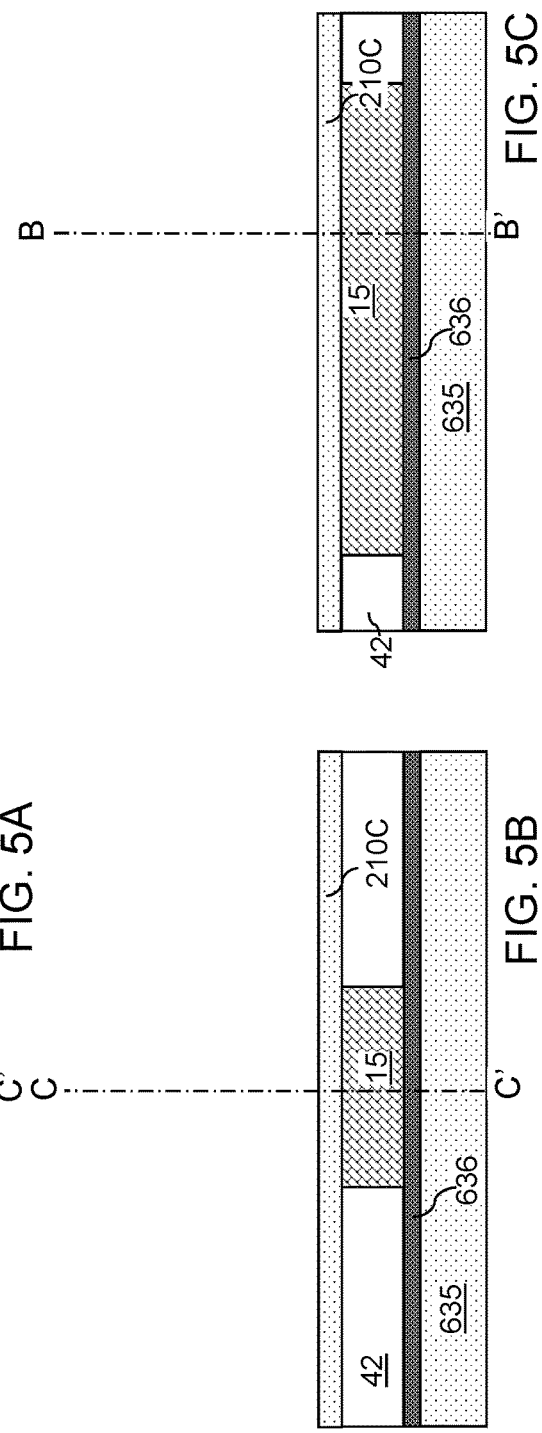

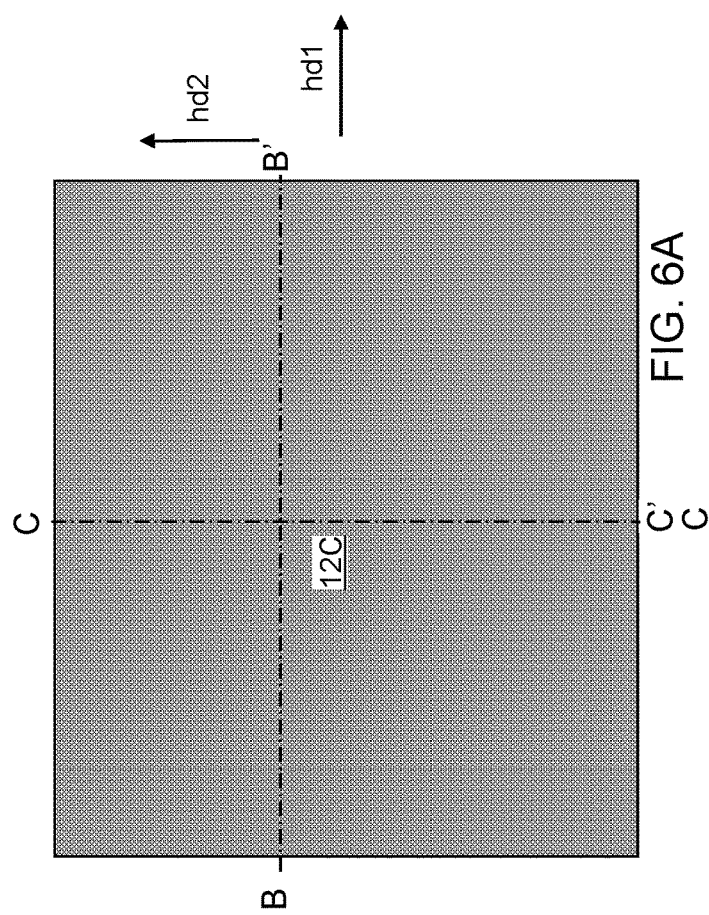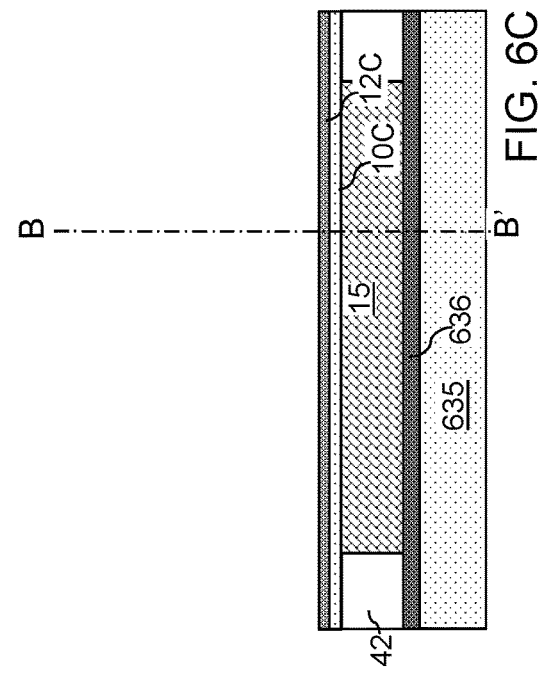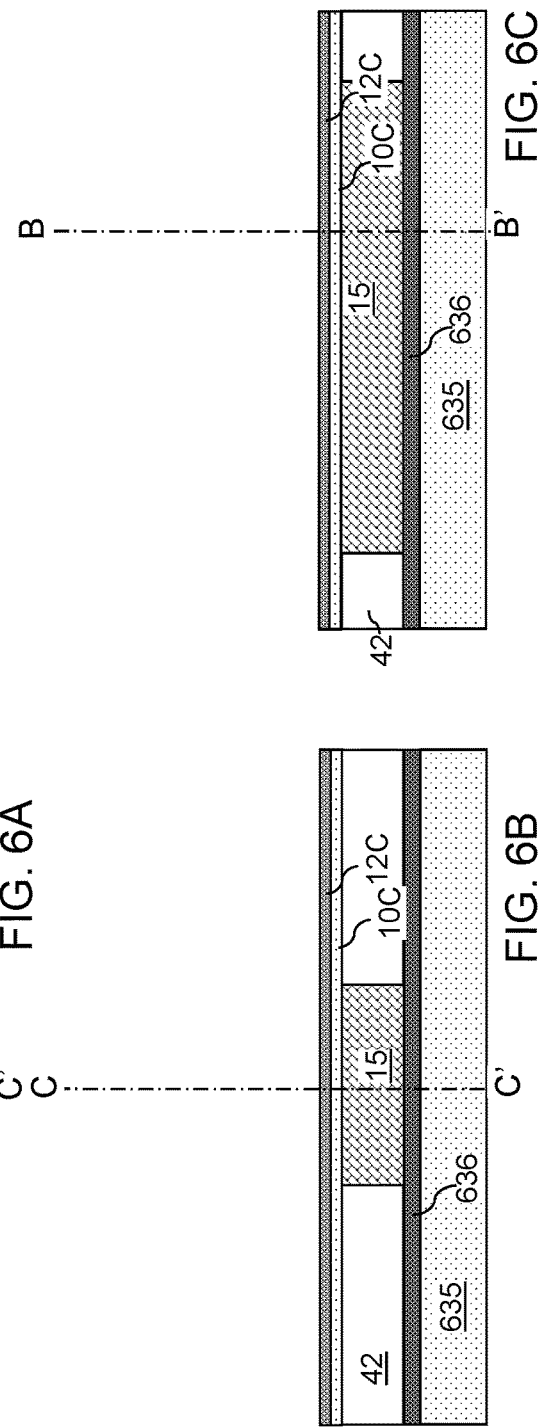

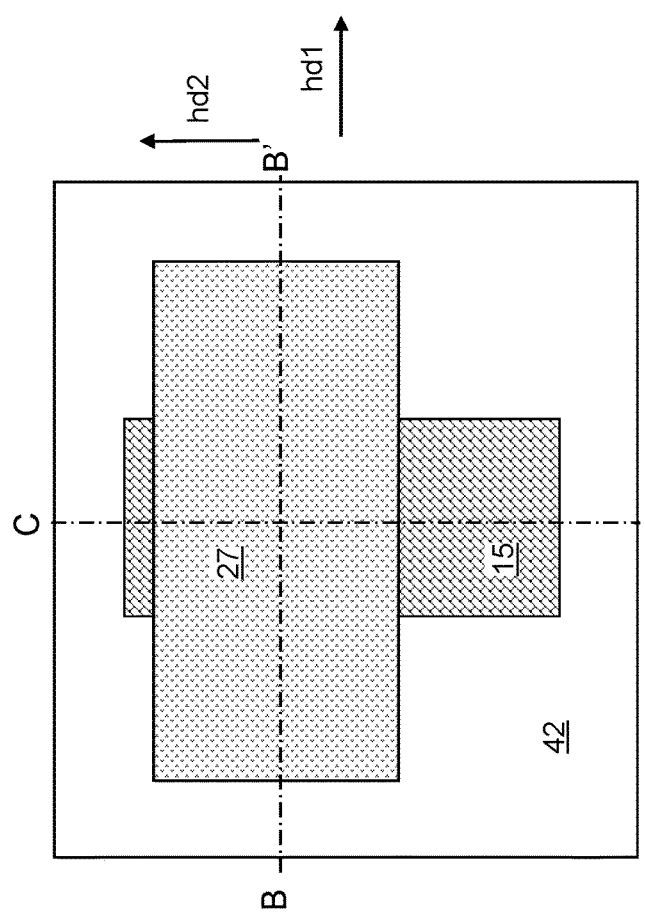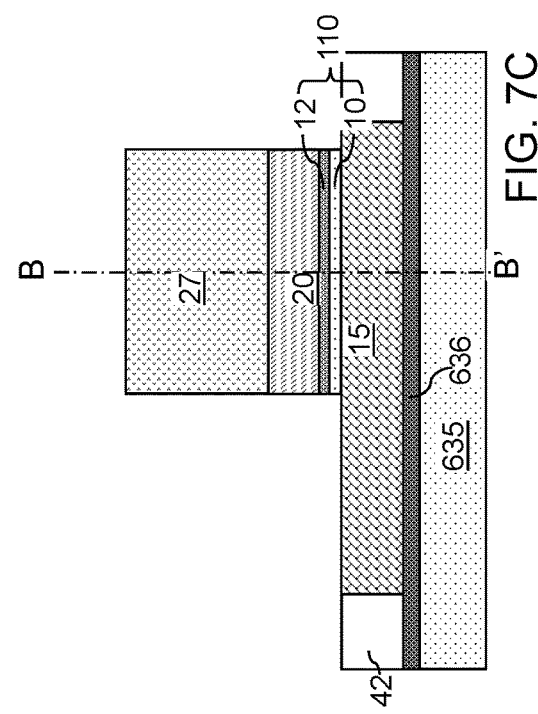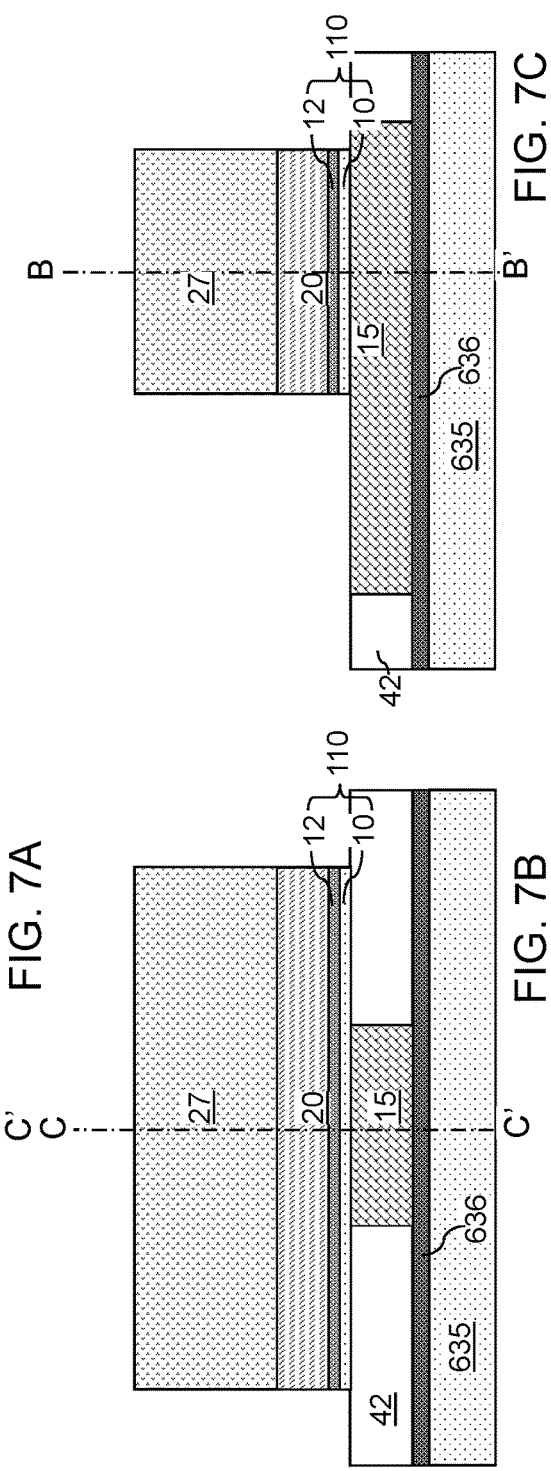

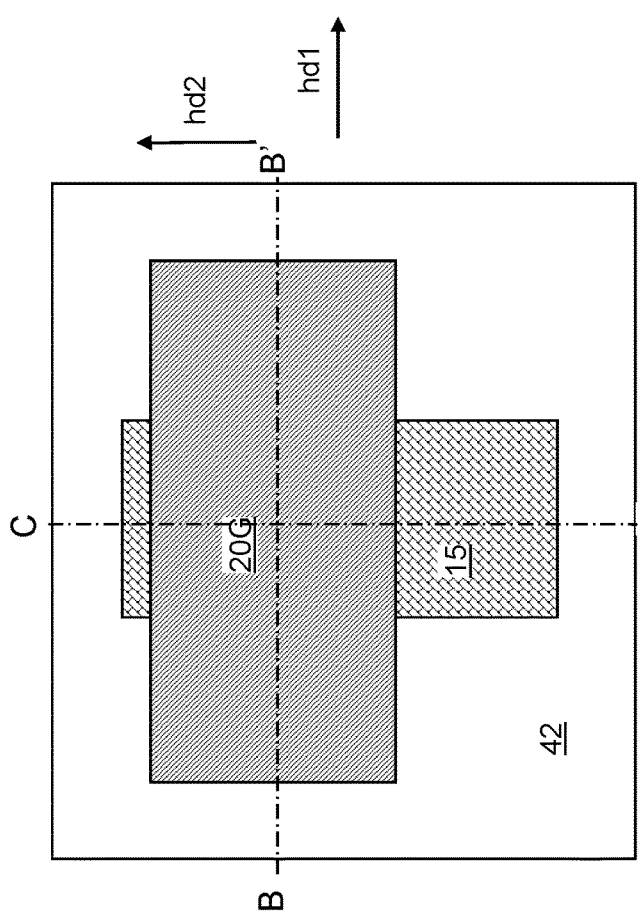
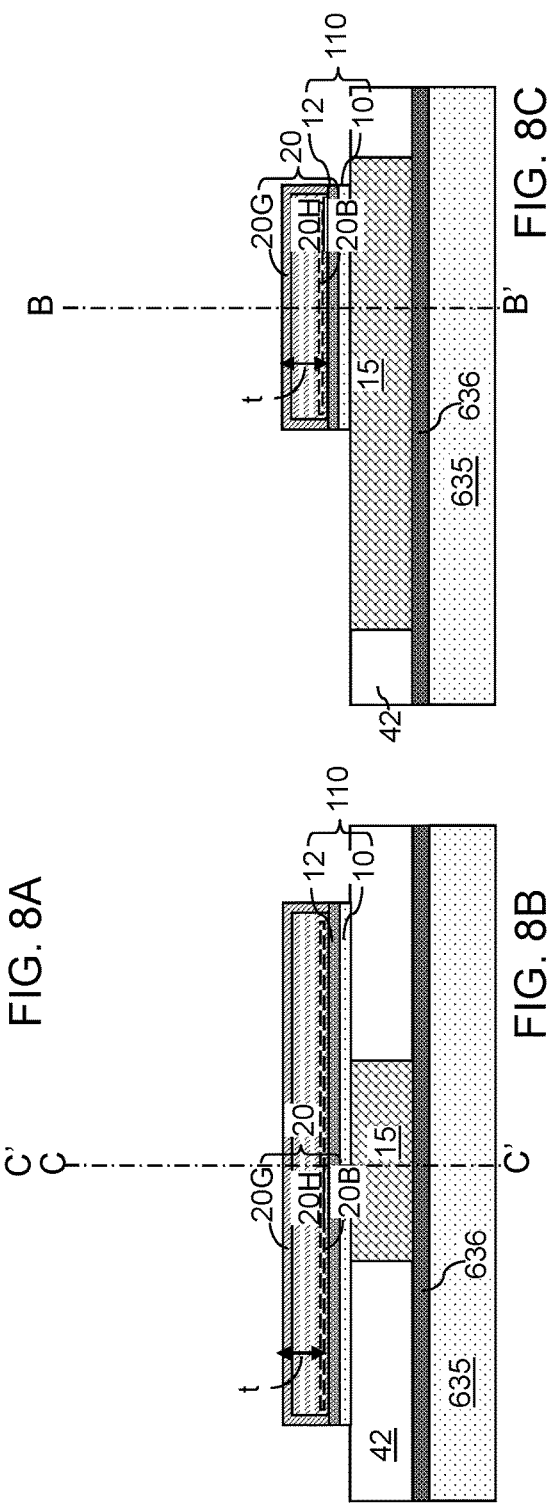
FIG. 8A
FIG. 8B
FIG. 8C

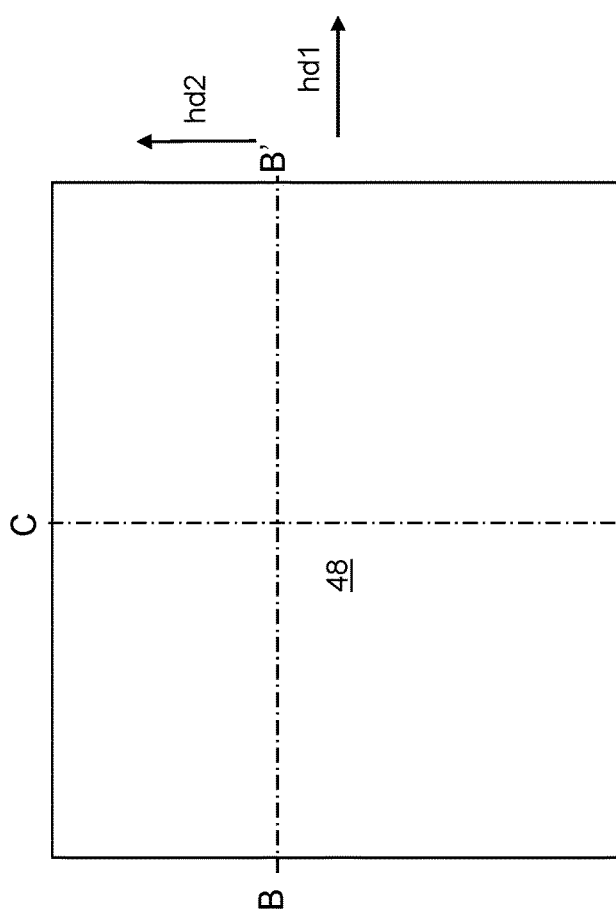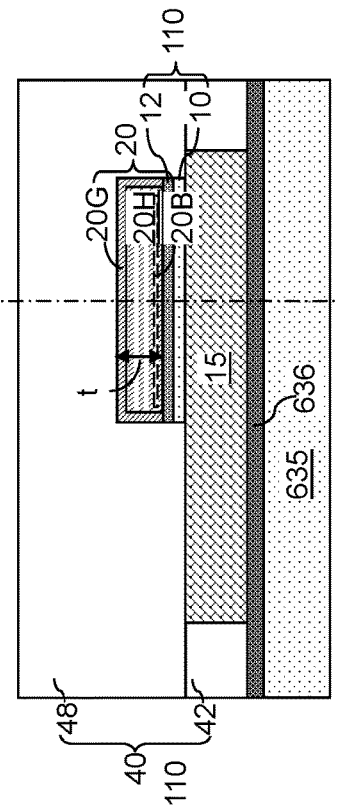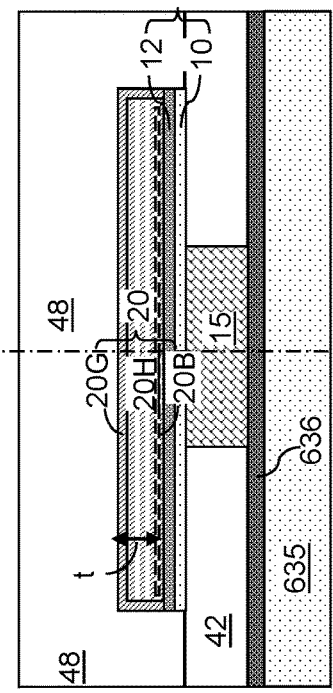

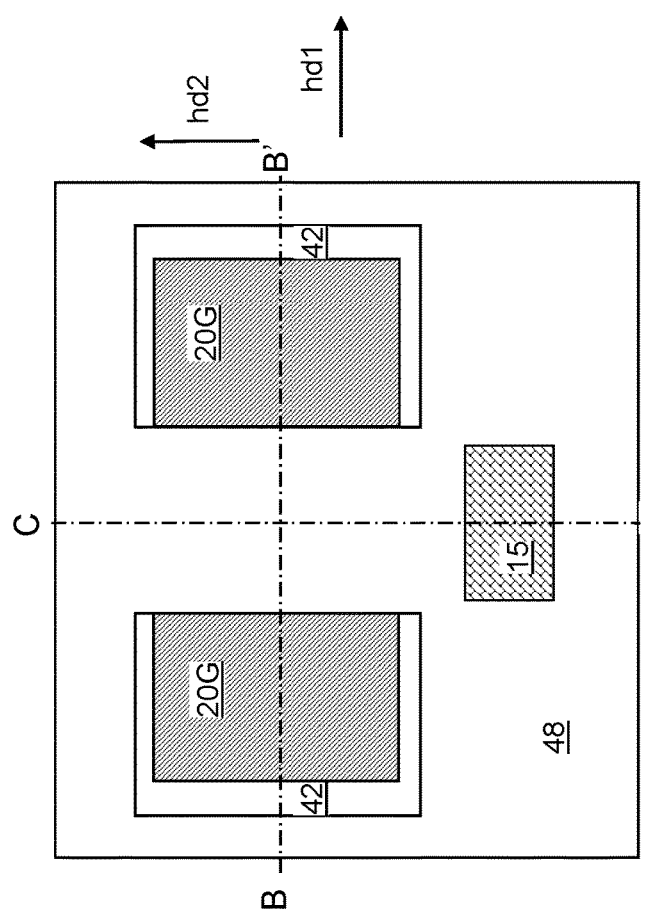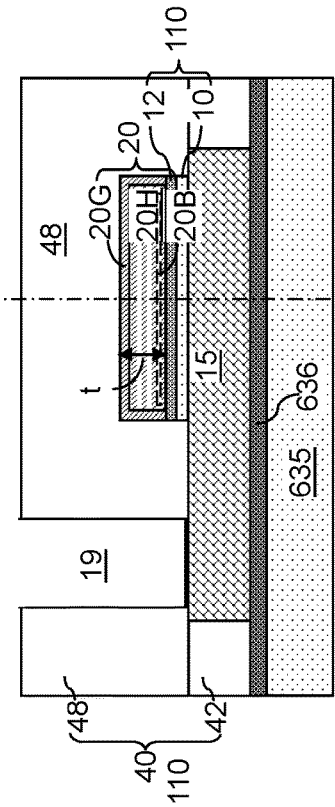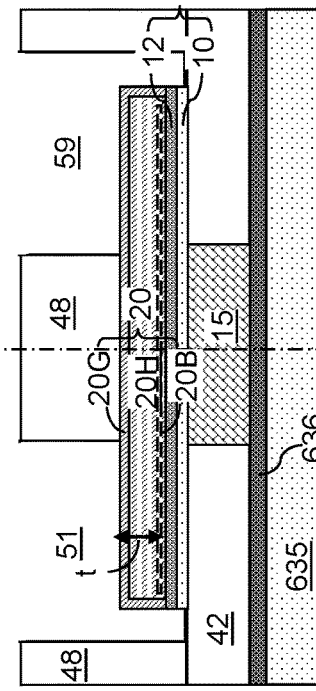
FIG. 10A
FIG. 10B
FIG. 10C

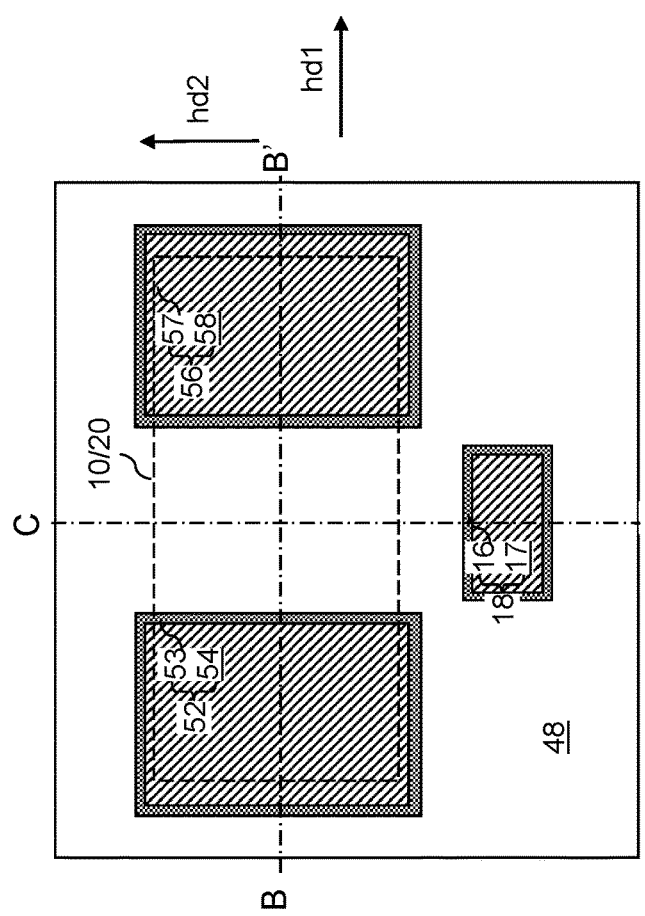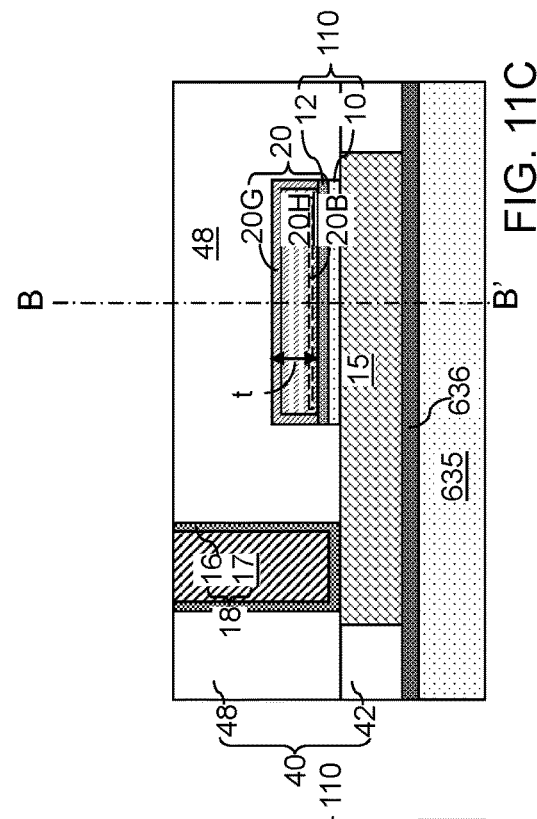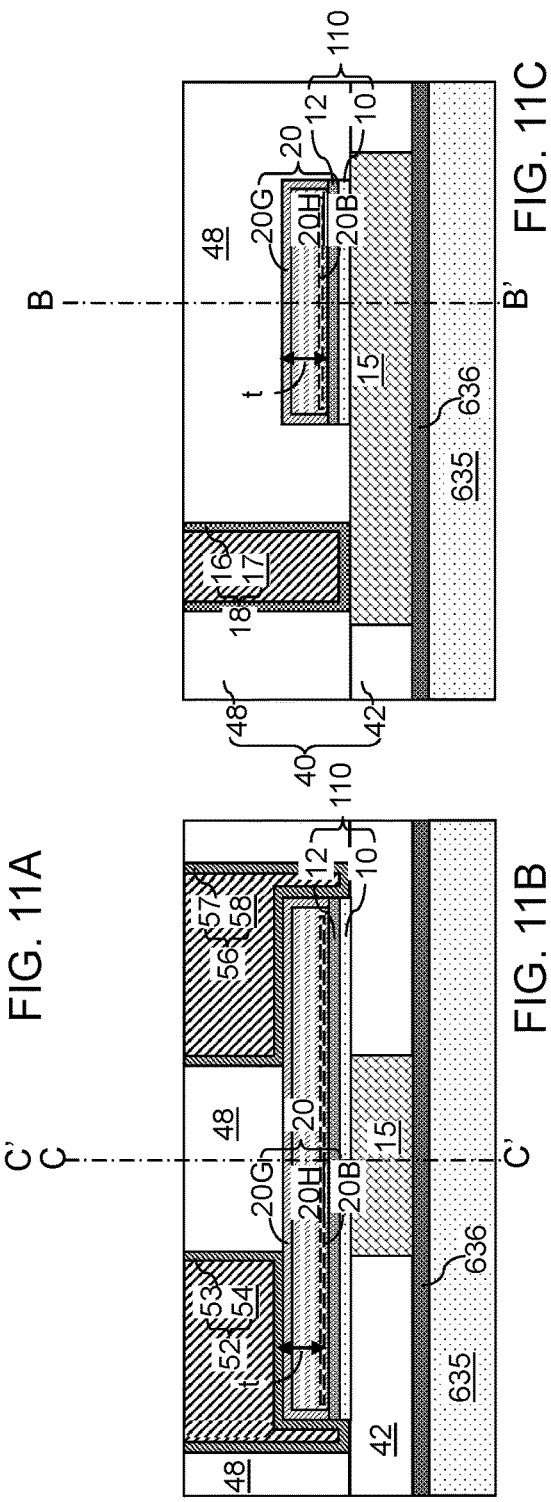

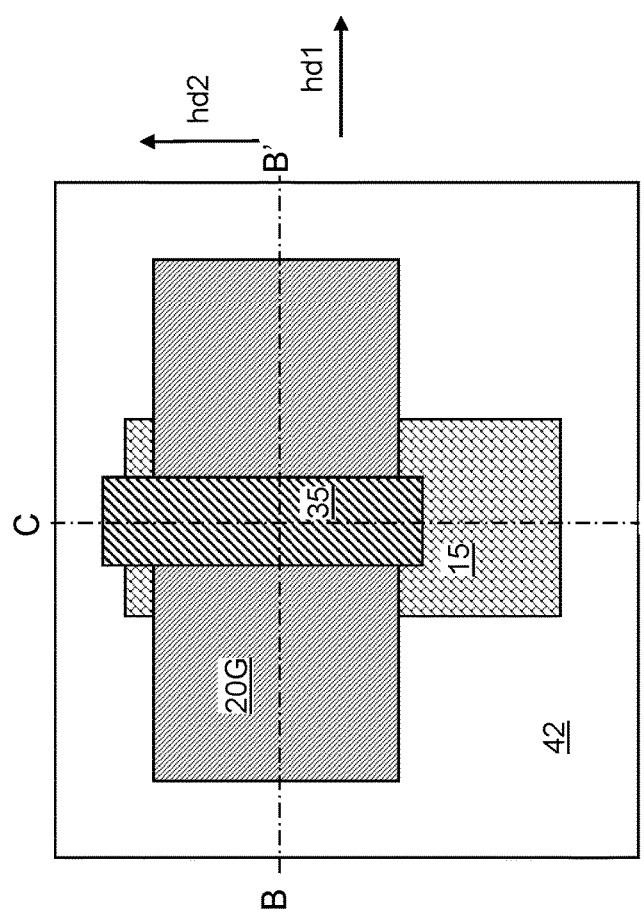
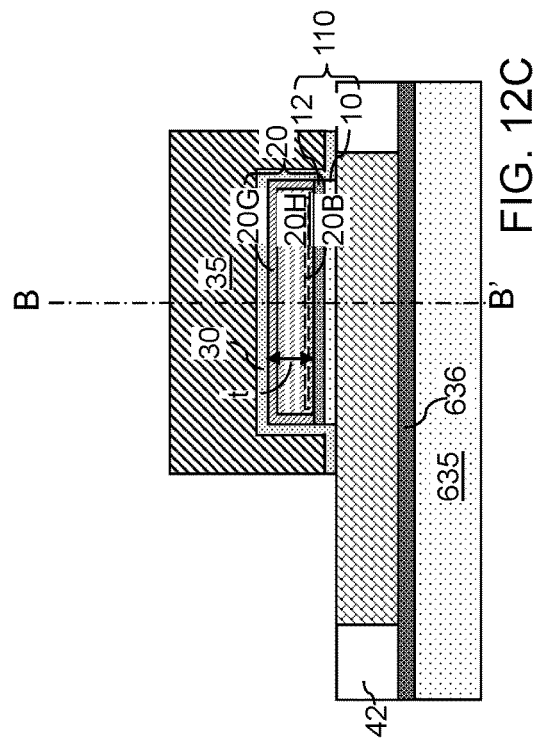
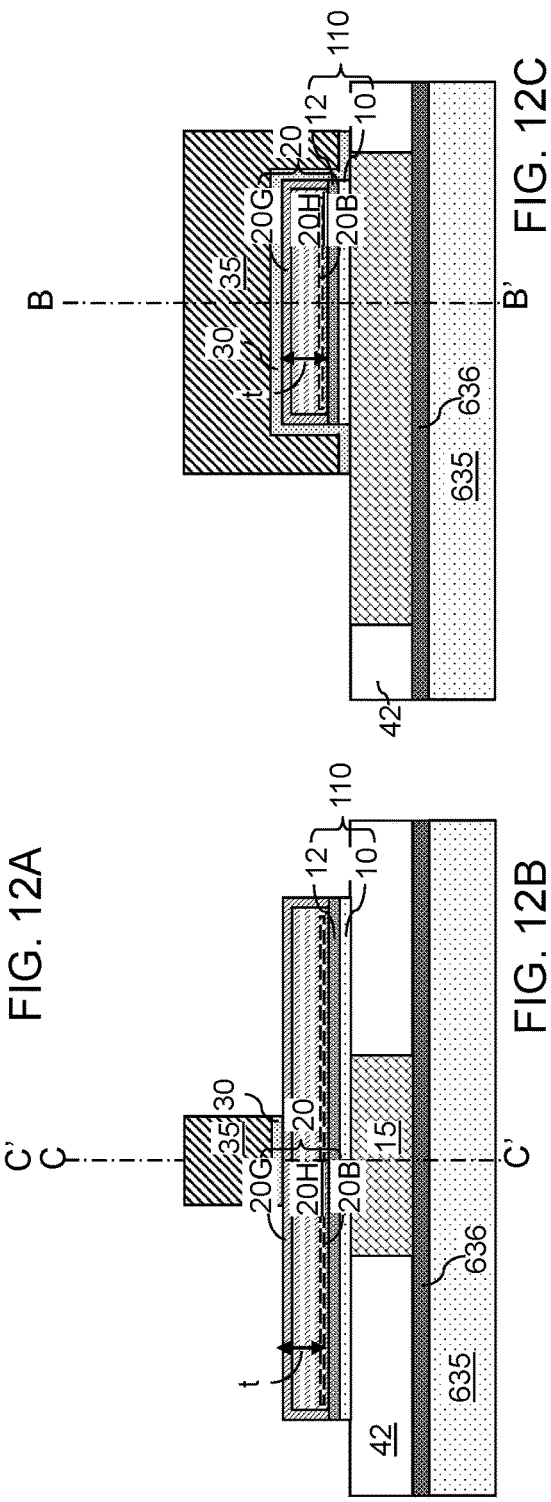
FIG. 12A
FIG. 12C
FIG. 12B

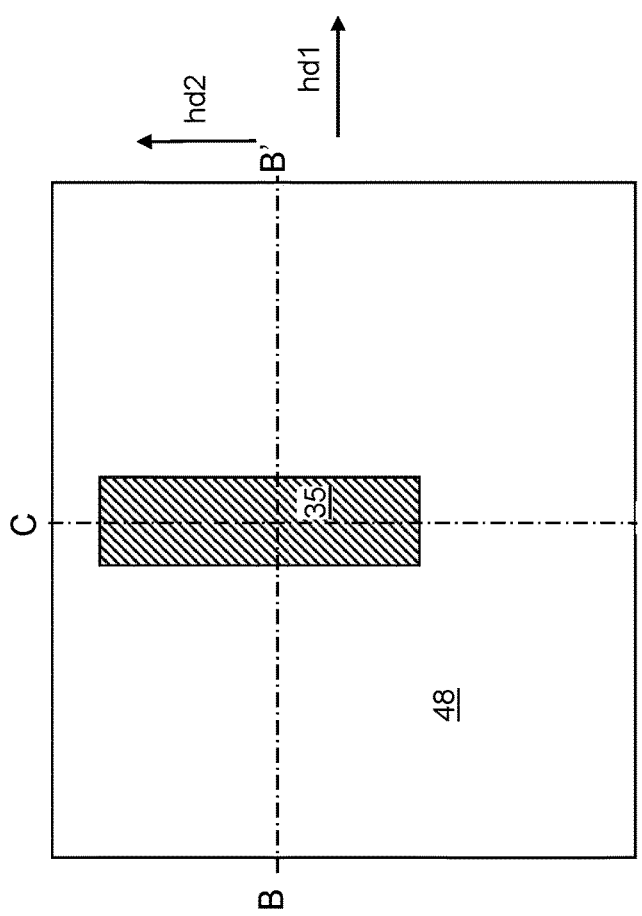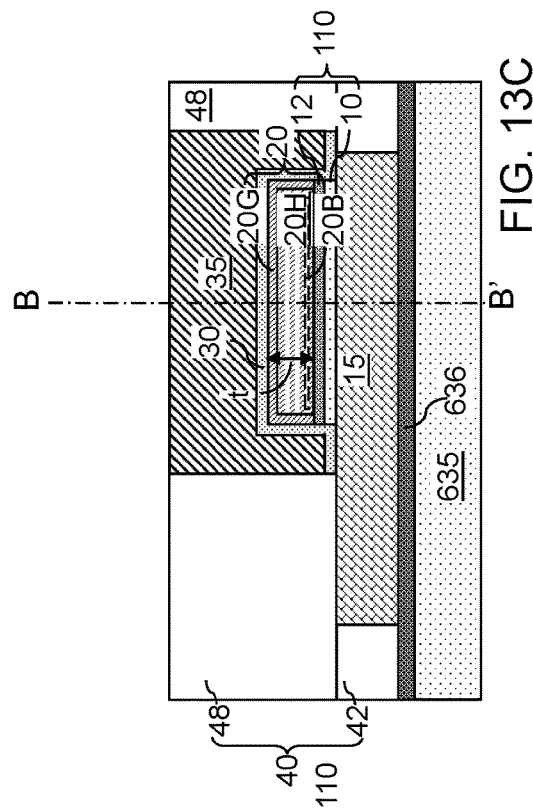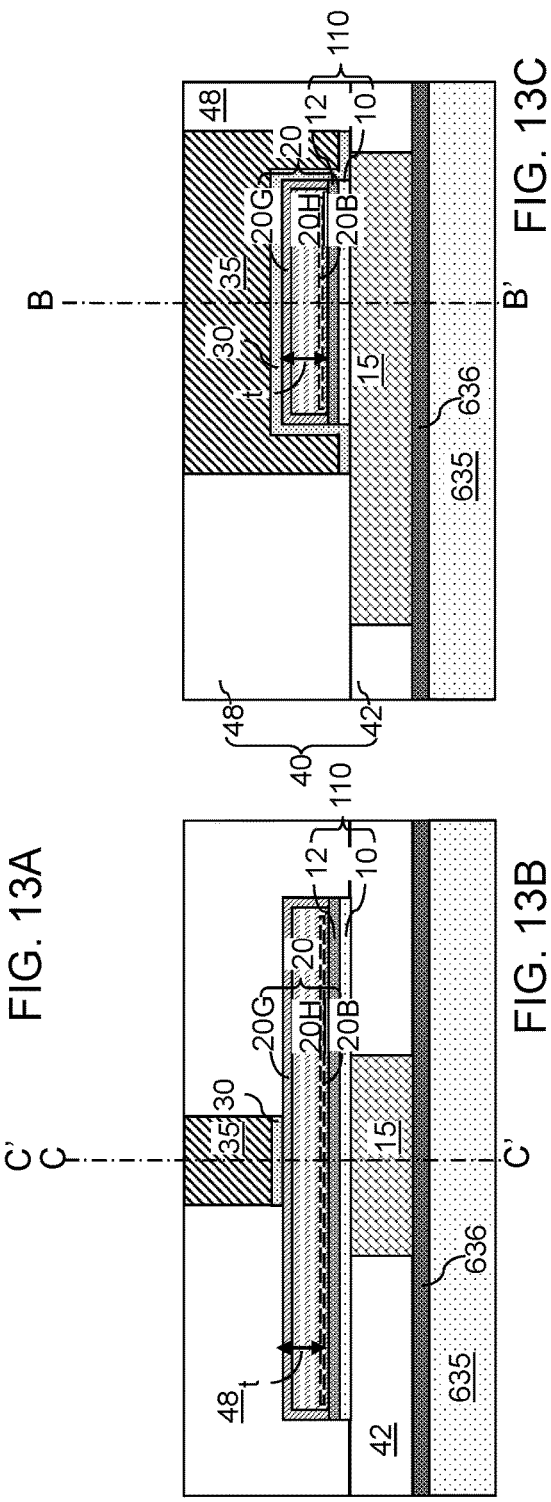

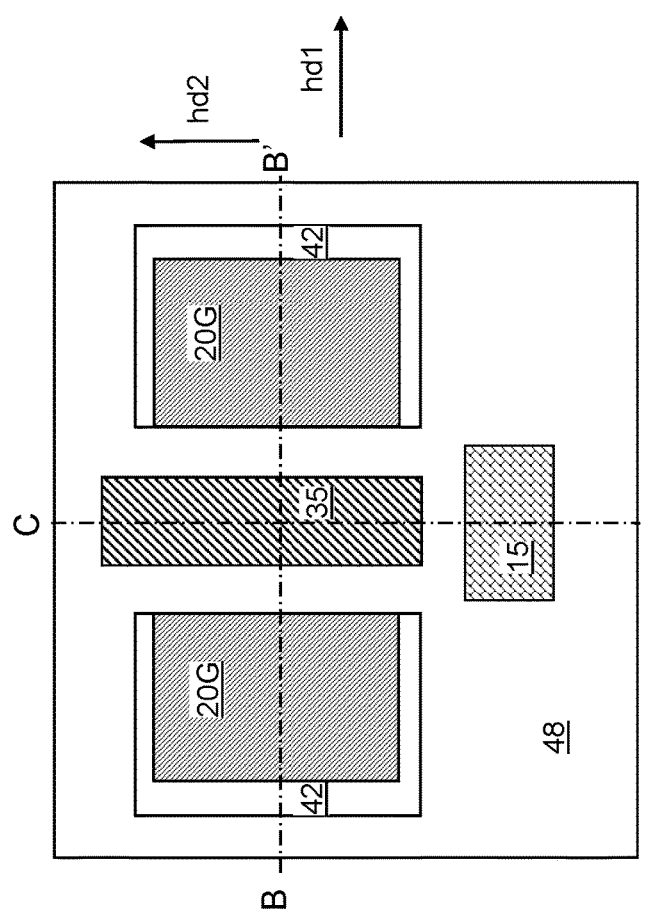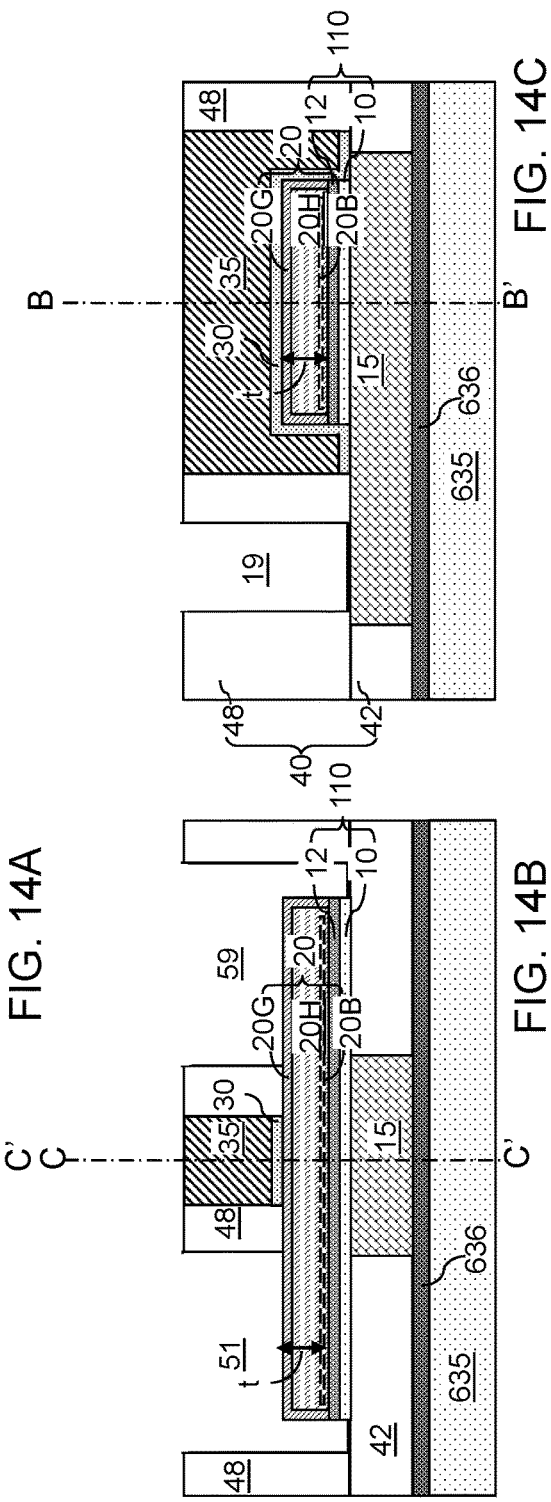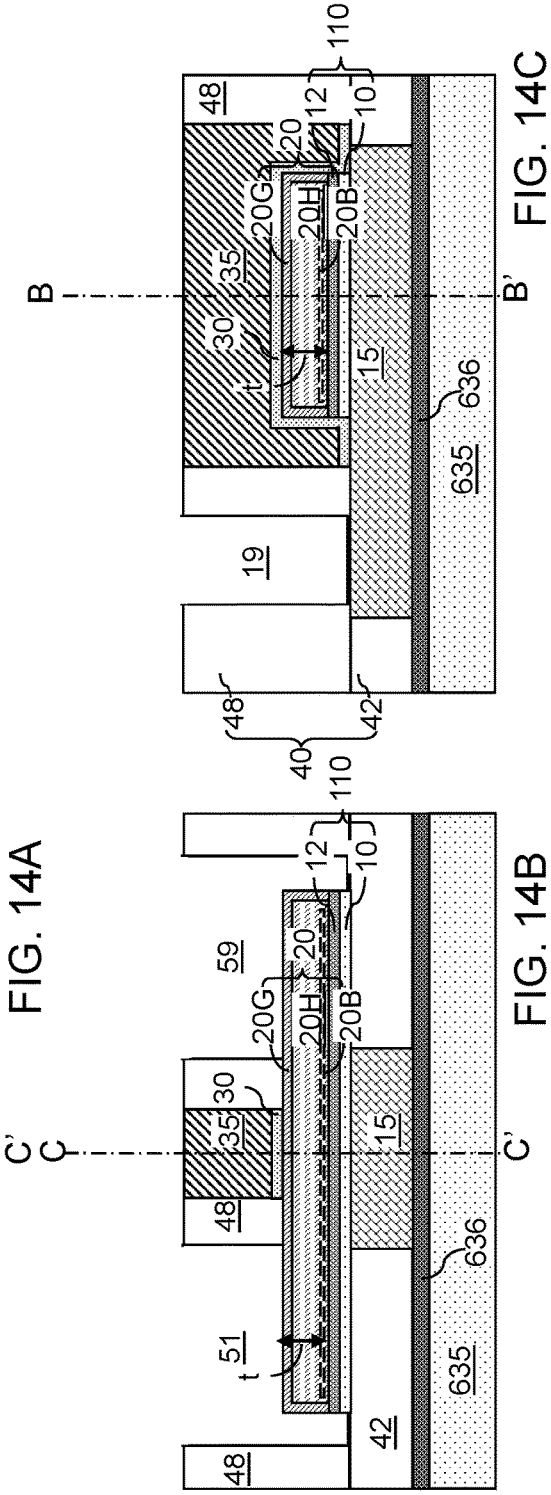

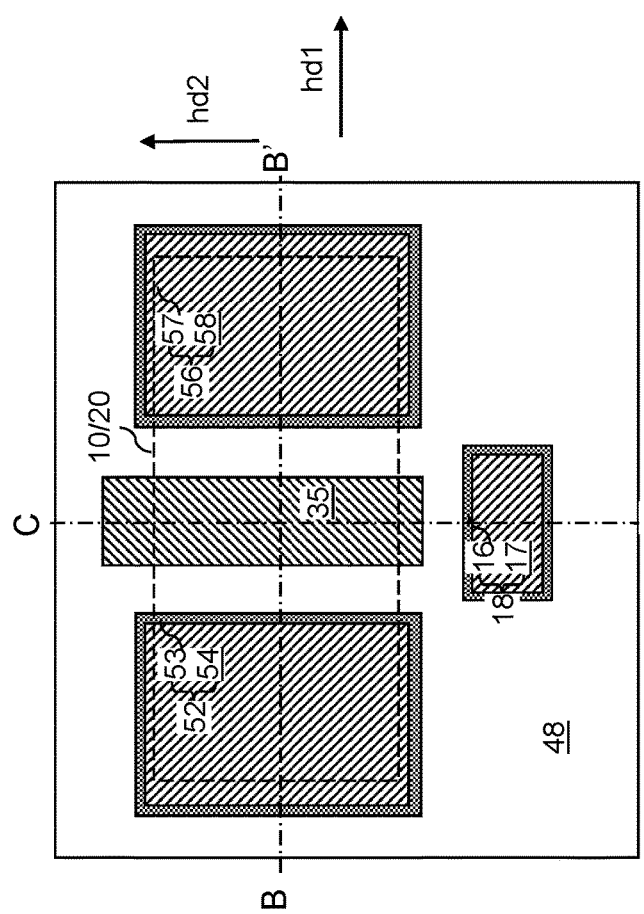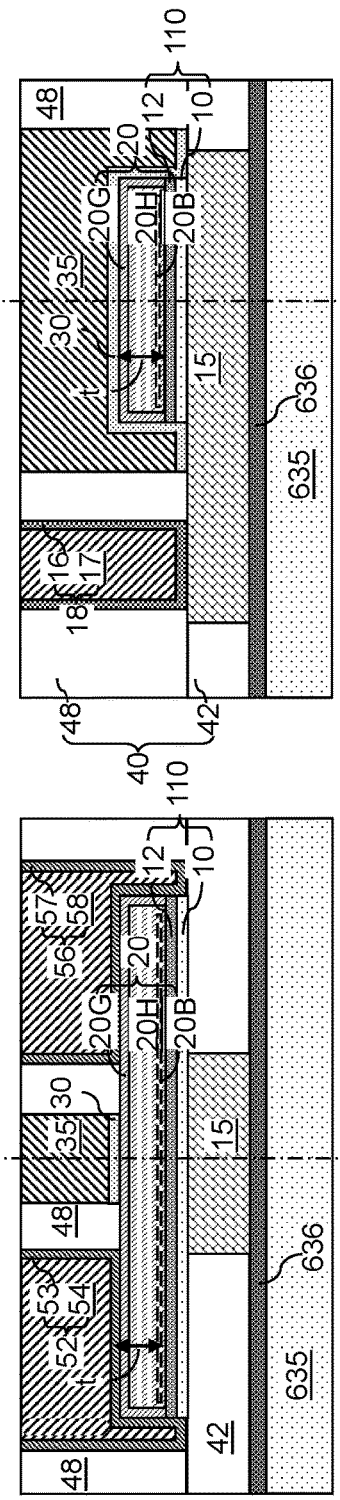

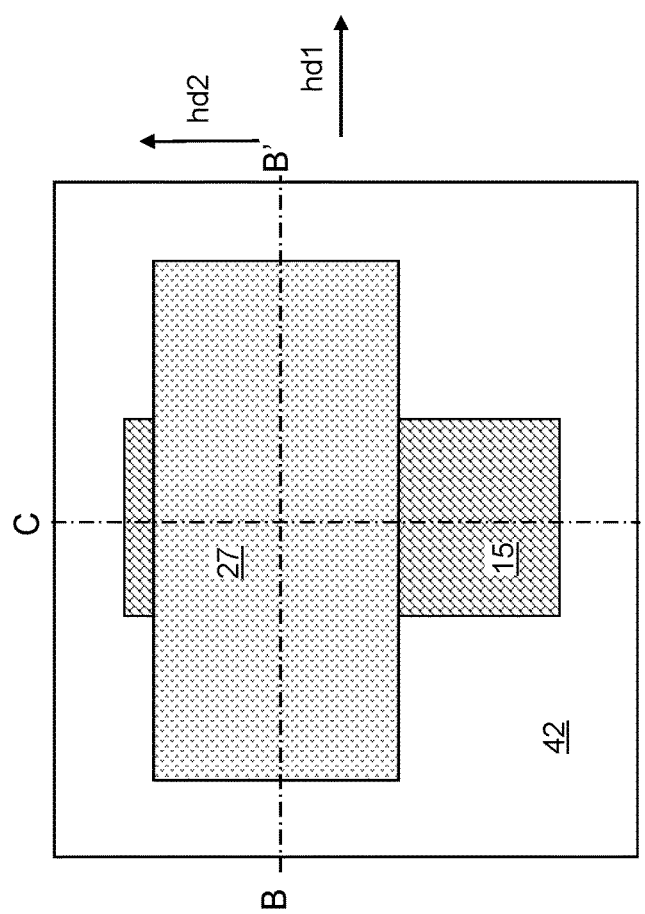
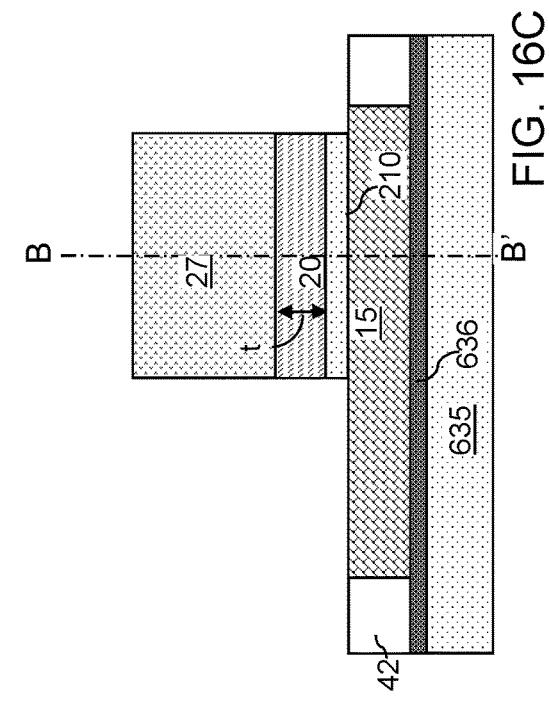
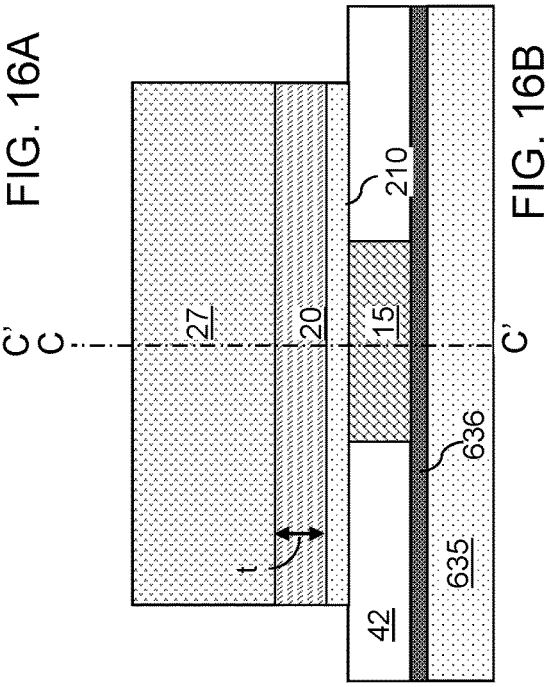
FIG. 16A
FIG. 16B
FIG. 16C

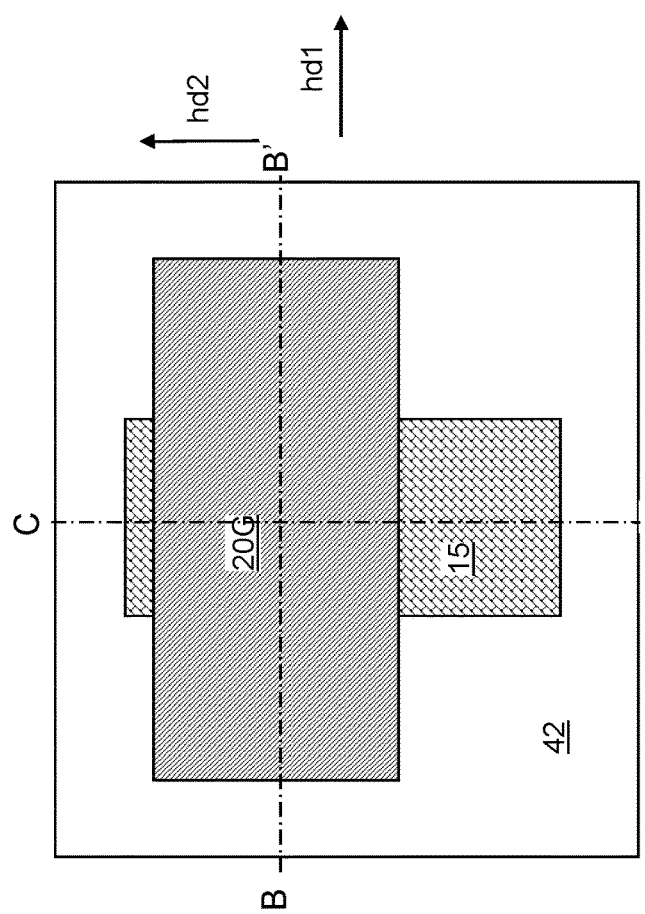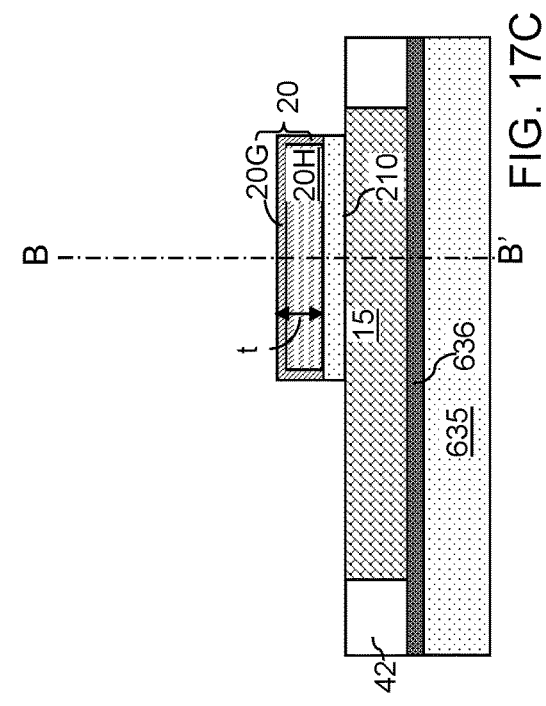
FIG. 17A
FIG. 17B
FIG. 17C

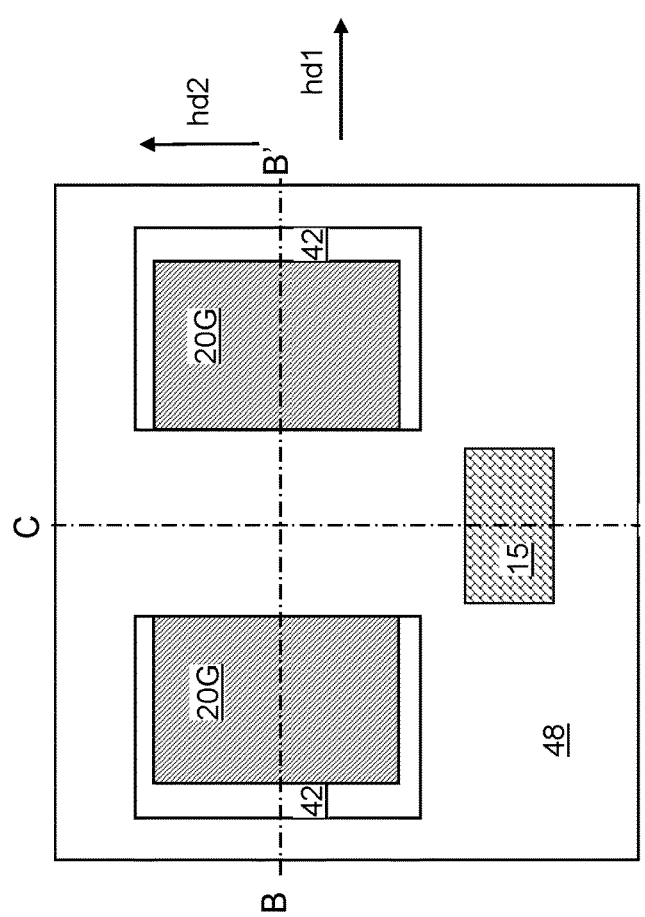
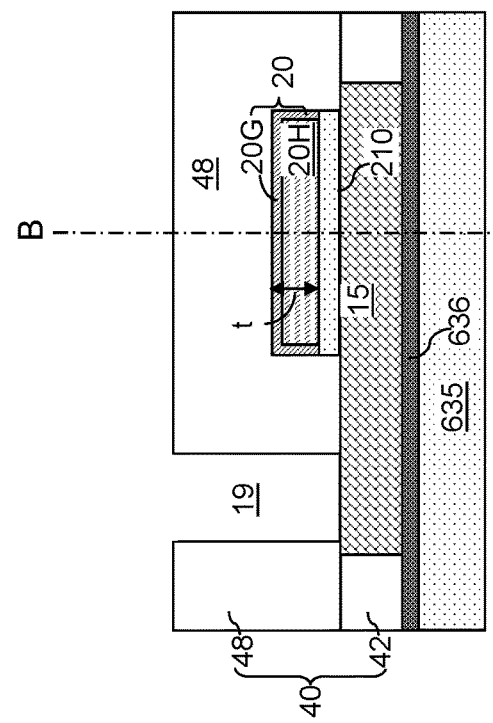
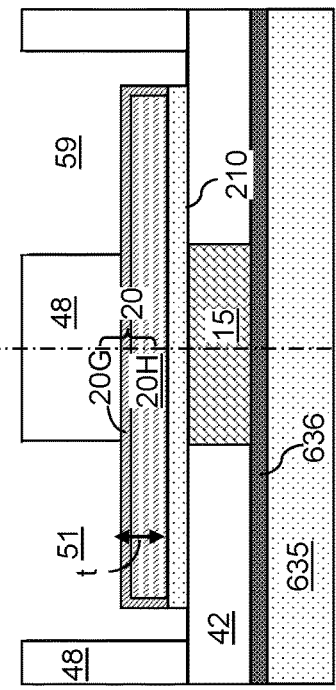
FIG. 18A
FIG. 18B
FIG. 18C

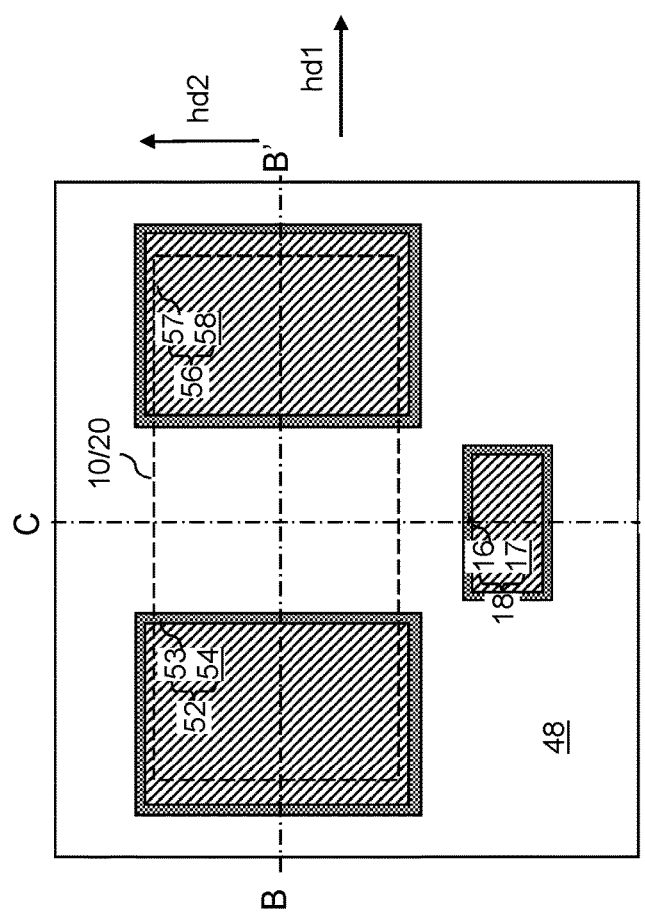
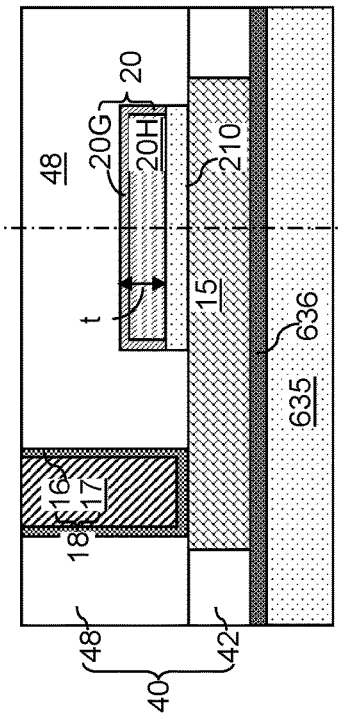
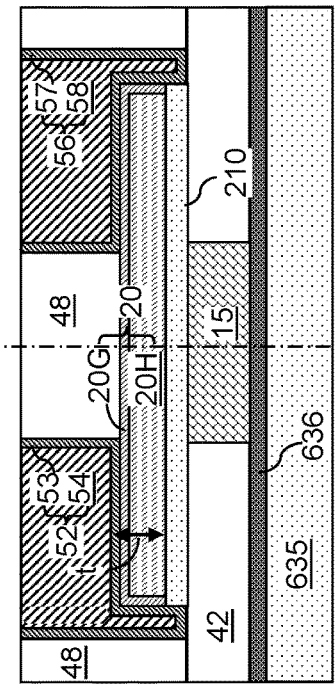
FIG. 19A
FIG. 19B
FIG. 19C

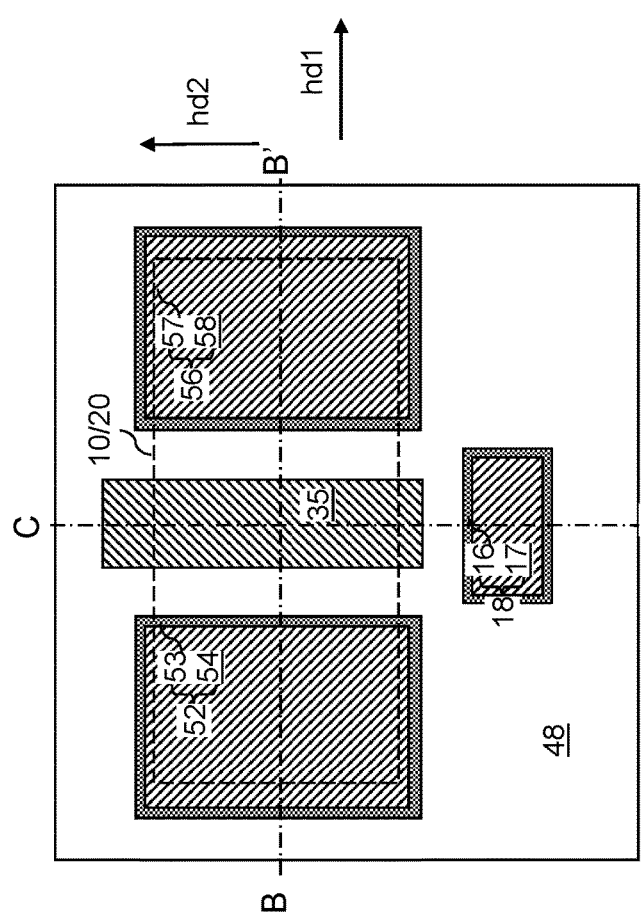
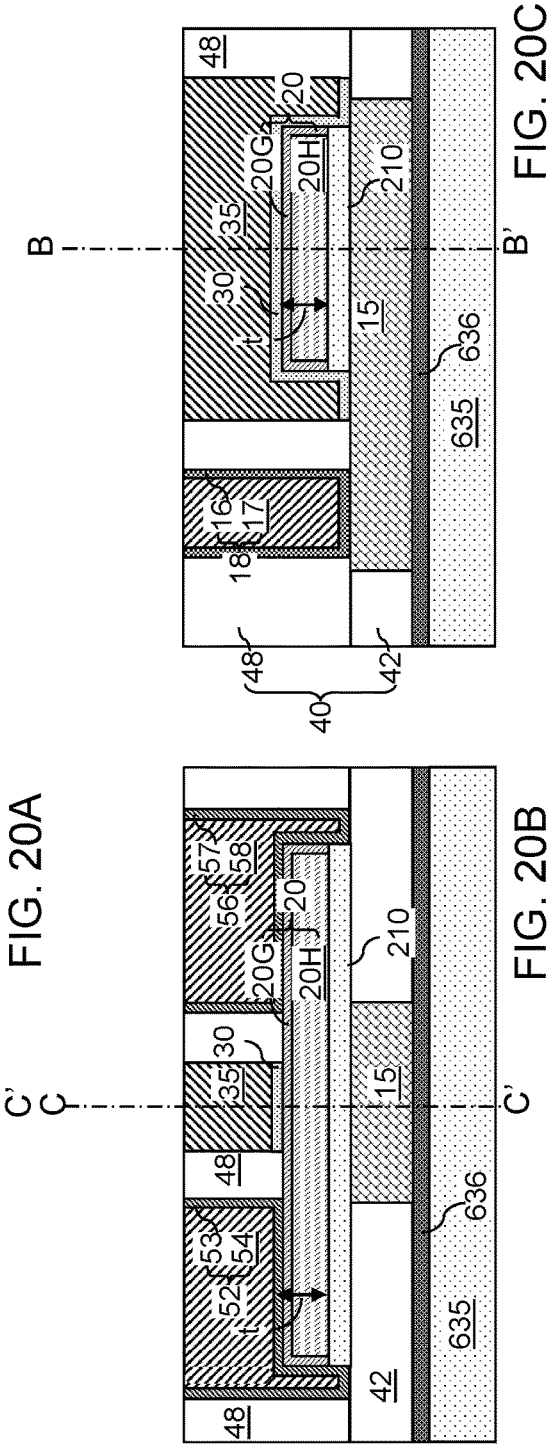
FIG. 20A
FIG. 20B
FIG. 20C

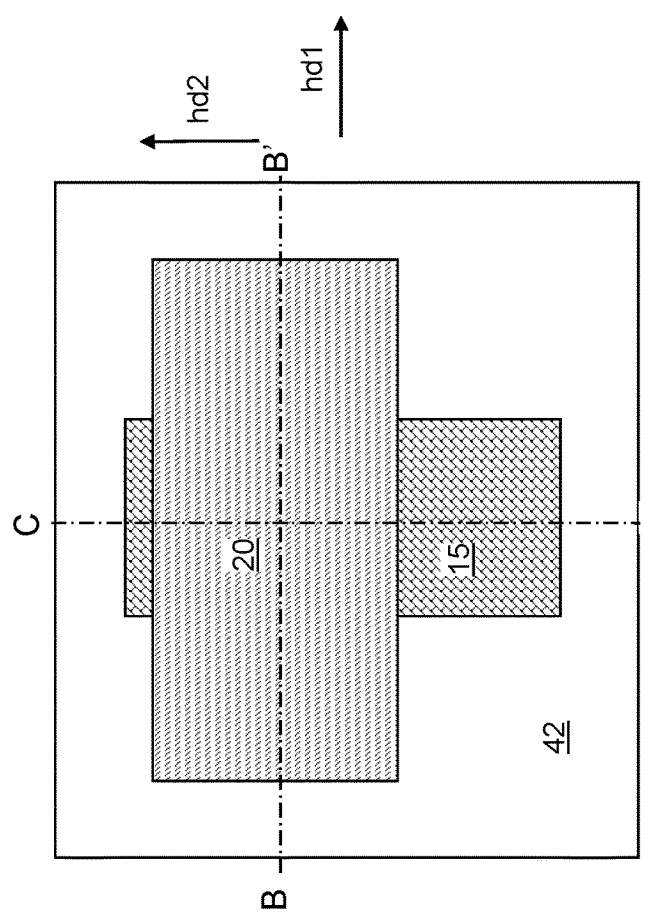
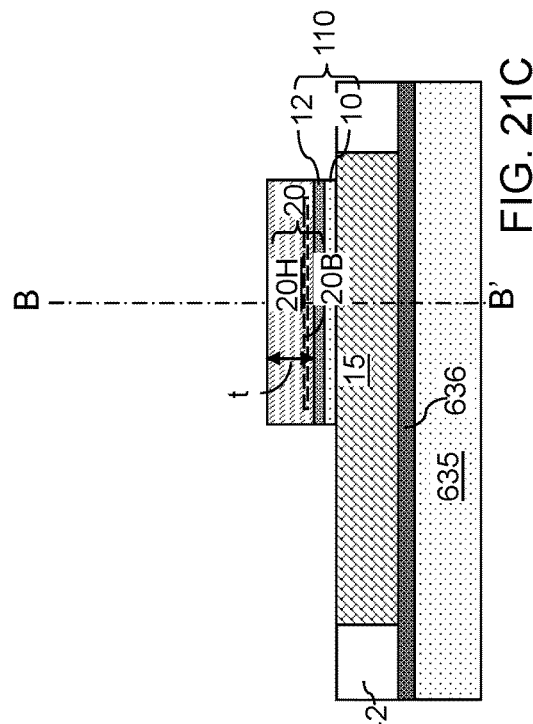
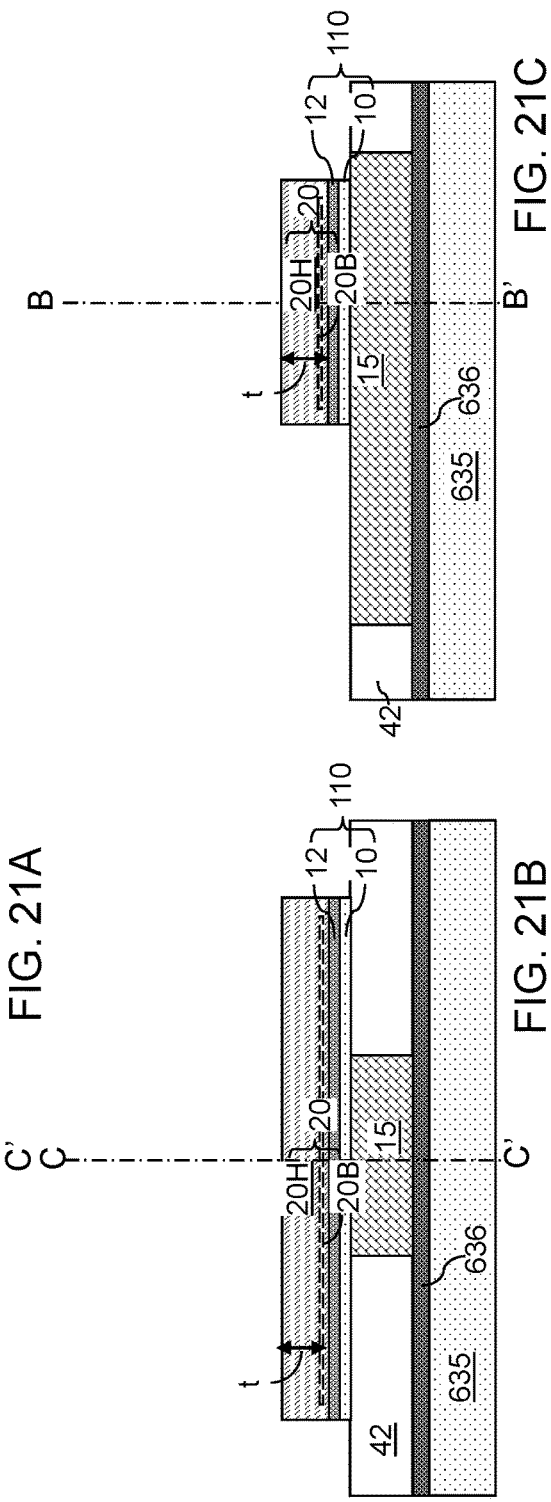
FIG. 21A
FIG. 21B
FIG. 21C

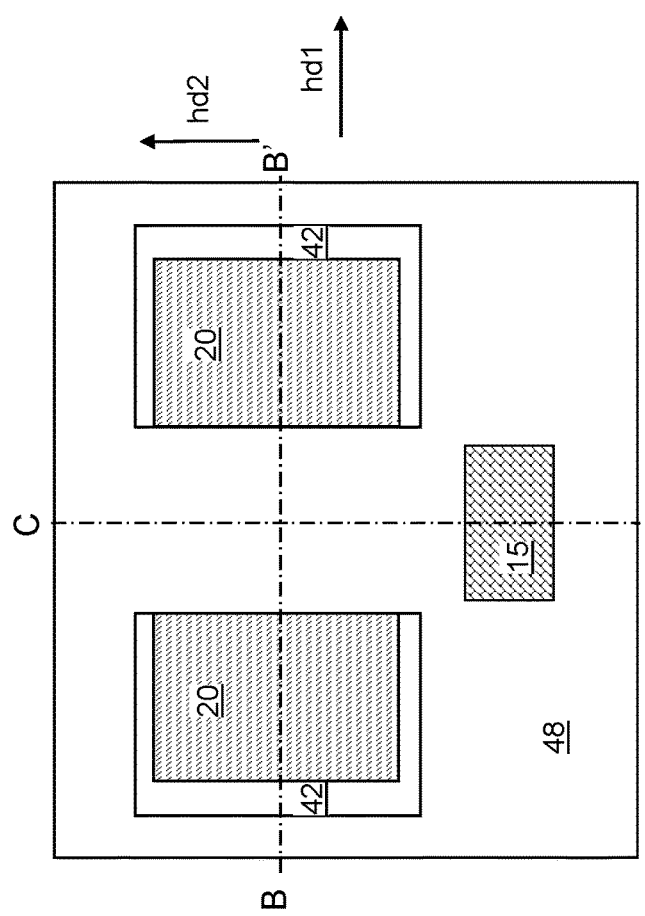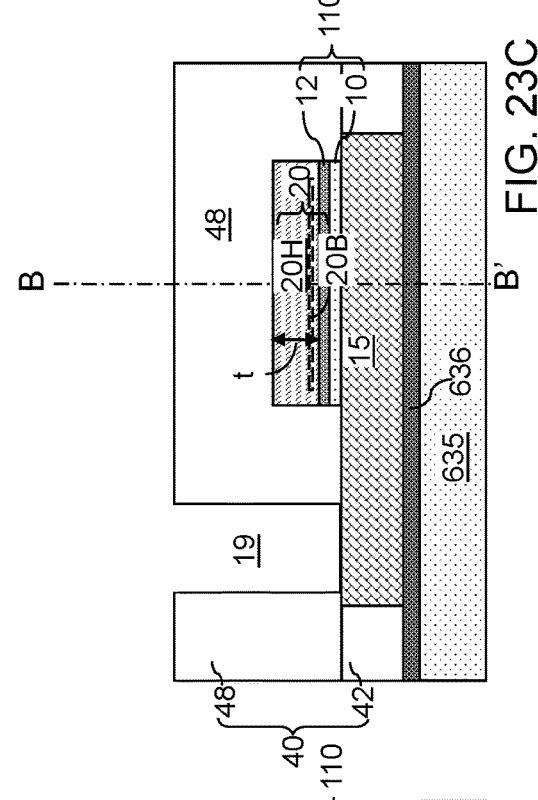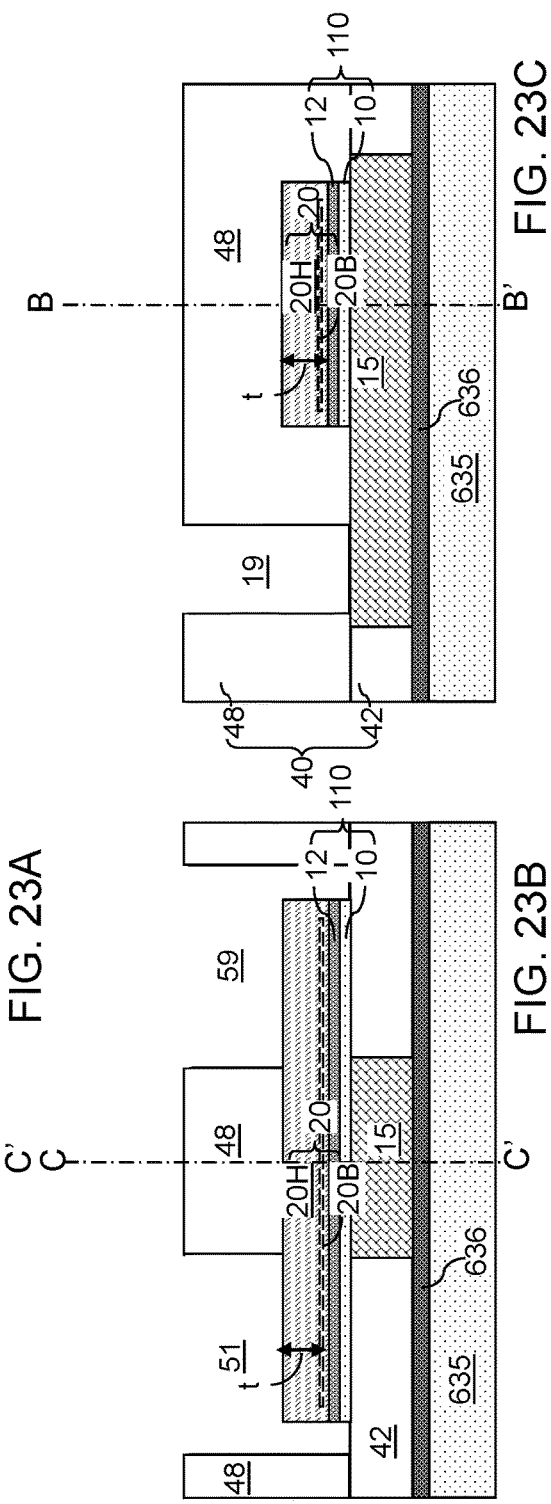
FIG. 23A
FIG. 23B
FIG. 23C

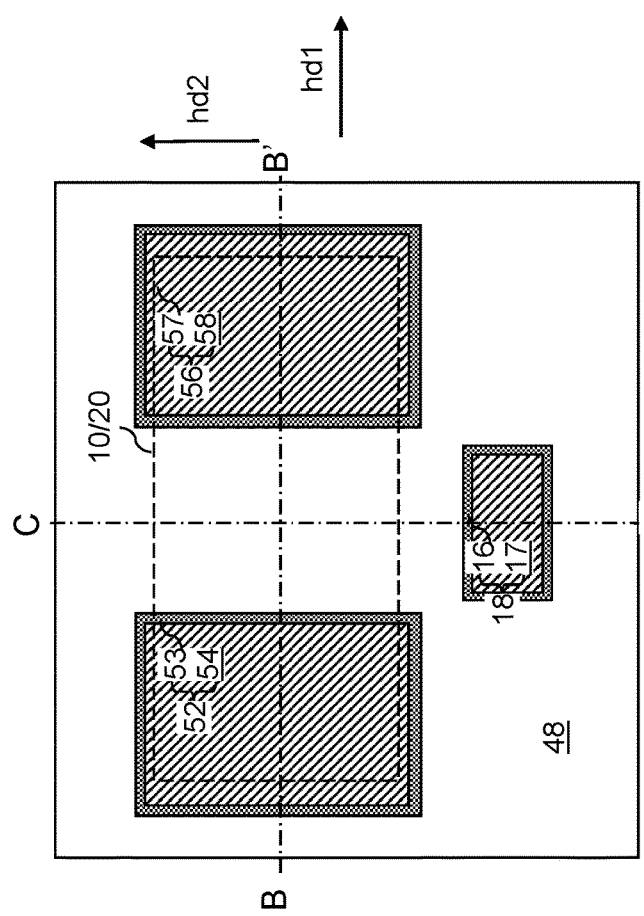
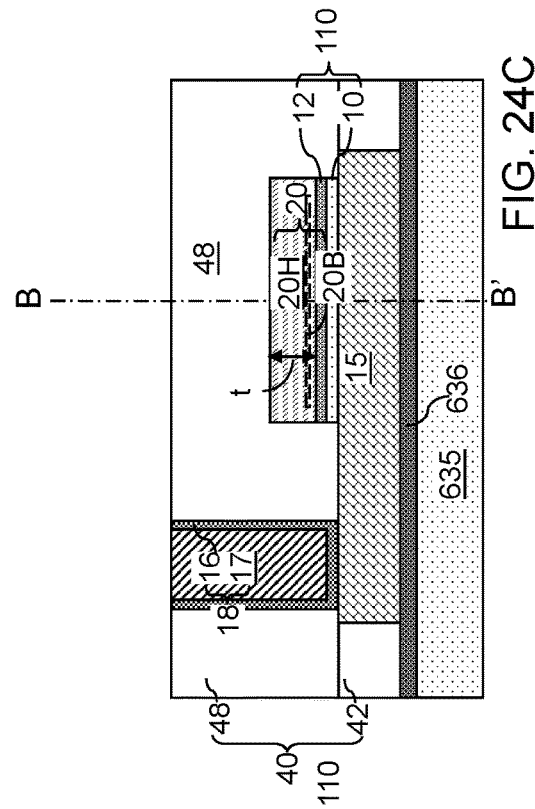
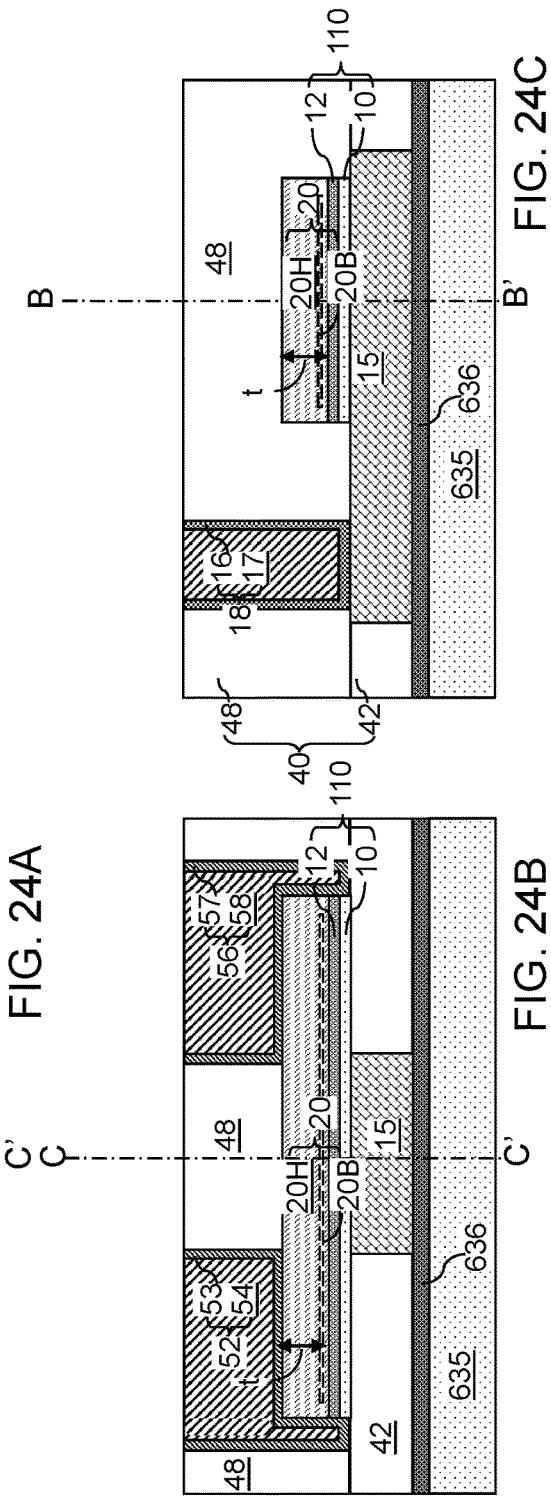
FIG. 24A
FIG. 24B
FIG. 24C

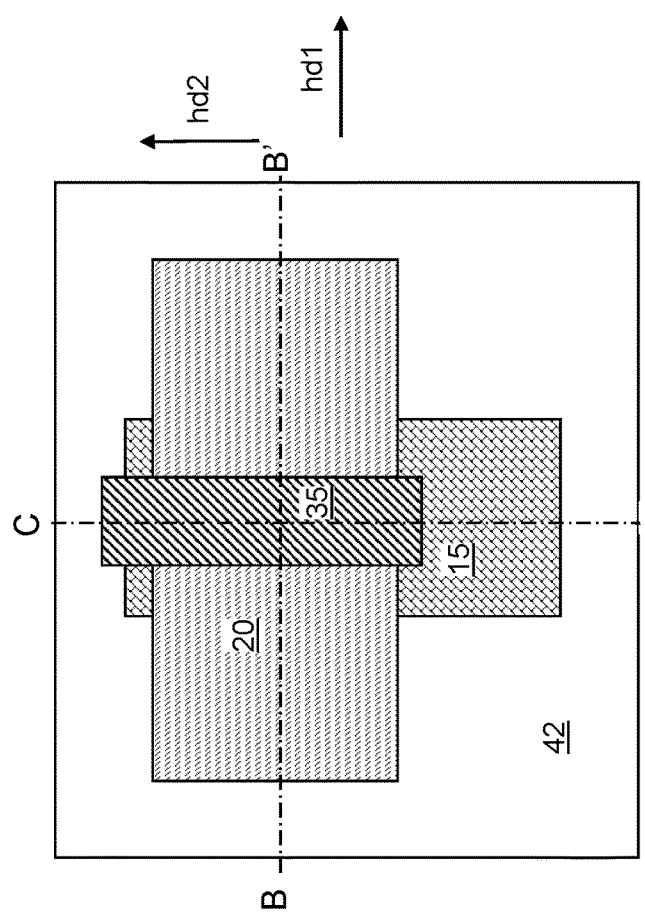
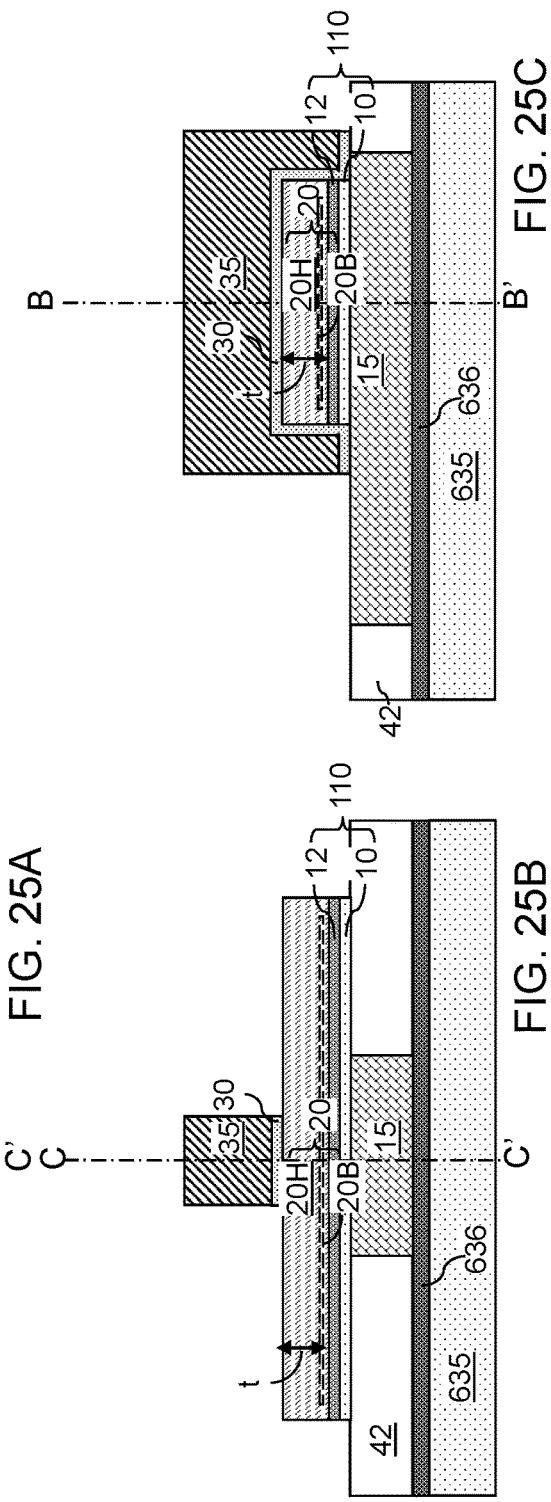
FIG. 25A
FIG. 25B
FIG. 25C

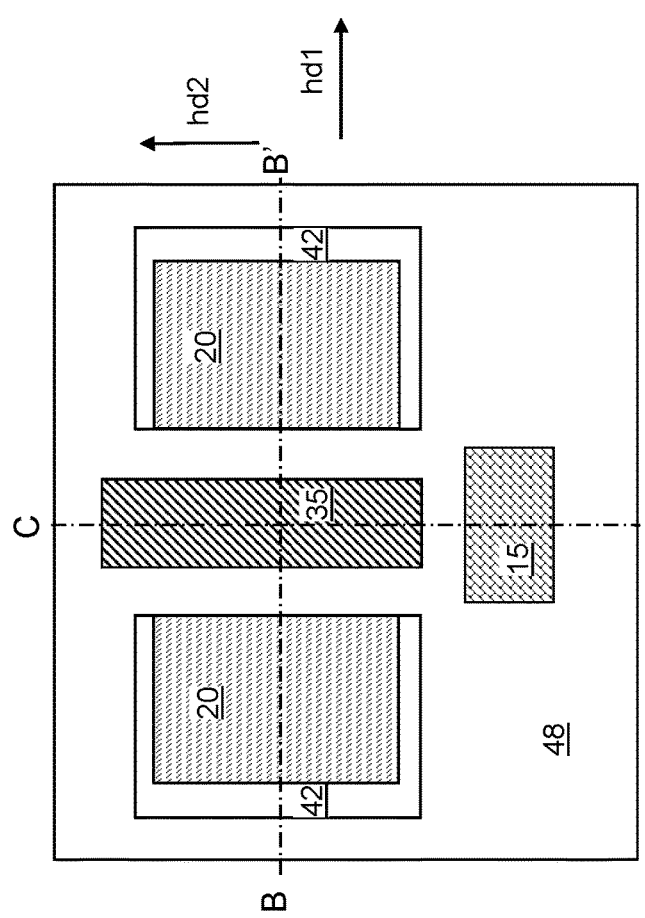
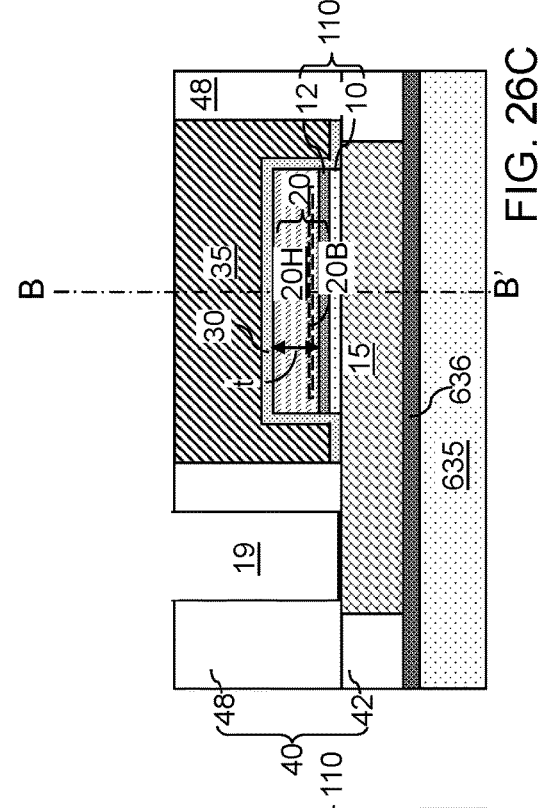
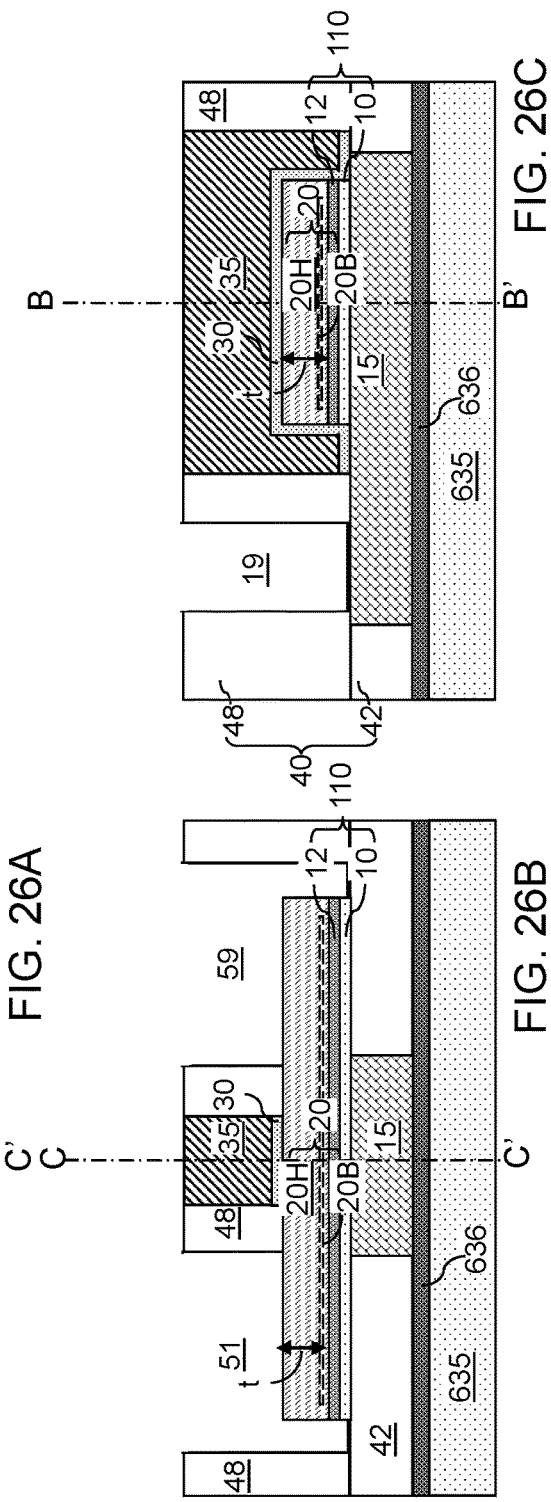
FIG. 26A
FIG. 26B
FIG. 26C

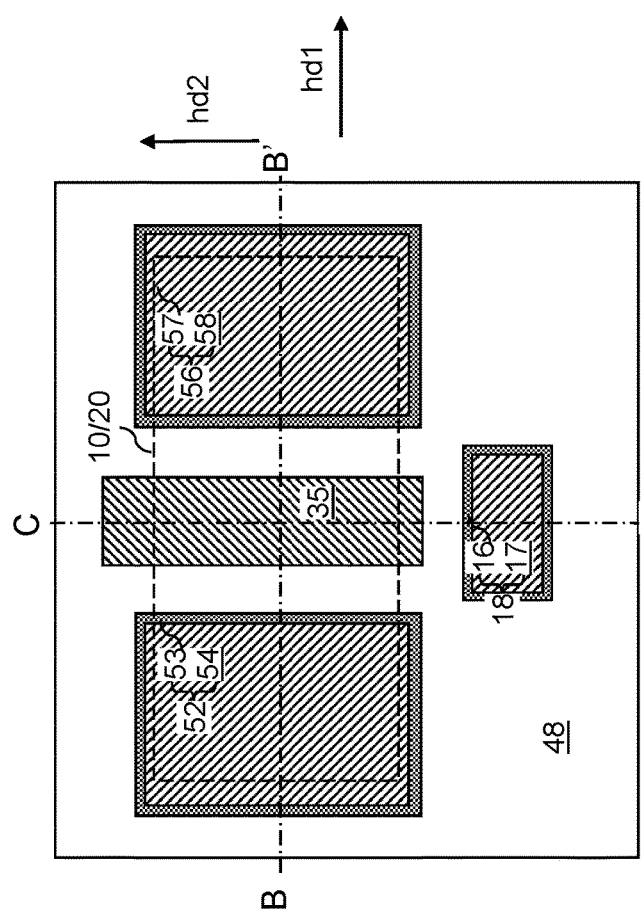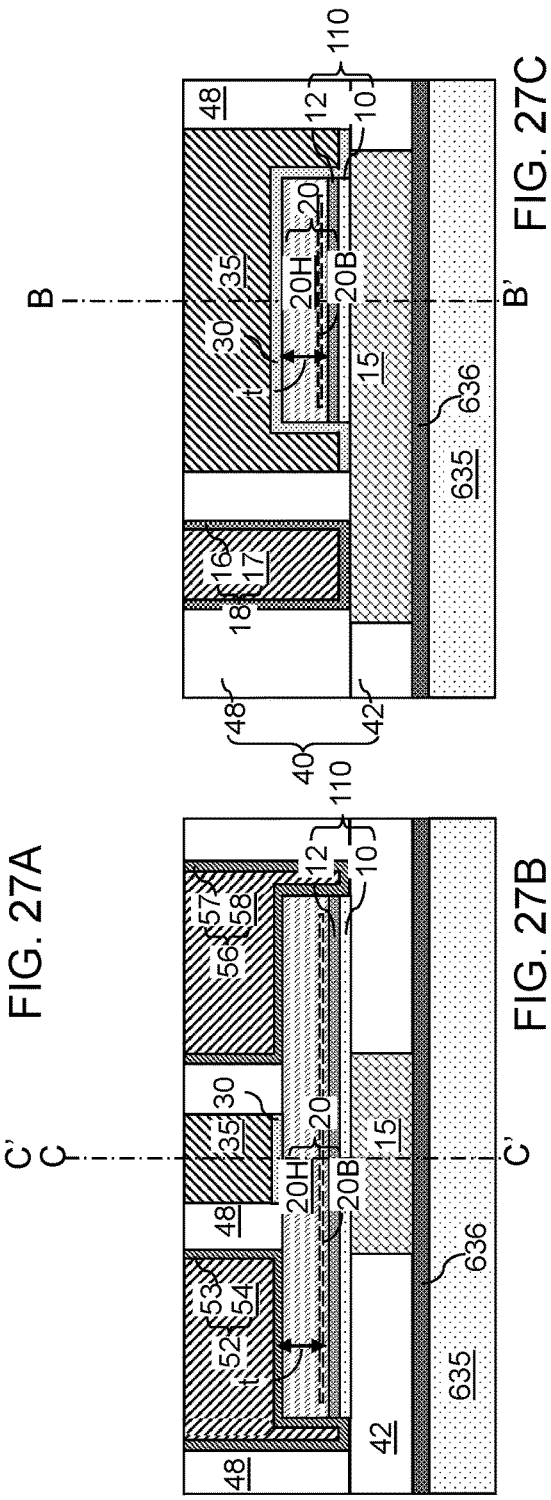

THIN FILM TRANSISTOR INCLUDING A COMPOSITIONALLY- GRADED GATE DIELECTRIC AND METHODS FOR FORMING THE SAME

RELATED APPLICATIONS

This application is a divisional Applications of U.S. application Ser. No. 17/467,497 entitled "Thin Film Transistor Including a Compositionally-Graded Gate Dielectric and Methods for Forming the Same," filed on Sep. 7, 2021, which claims the benefit of priority from a U.S. provisional application Ser. No. 63/147,274, entitled "A Structure of TFT for Avoiding Indium Diffusion" filed on Feb. 9, 2021, the entire contents of both of which are incorporated herein by reference for all purposes.

BACKGROUND

Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques may not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a portion of the first exemplary structure after formation of an insulating layer according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of a region of the first exemplary structure after formation of a recess region in the insulating layer according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of a region of the first exemplary structure after formation of a bottom gate electrode according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of a region of the first exemplary structure after formation of a continuous gate dielectric layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 6A is a top-down view of a region of the first exemplary structure after formation of a continuous compositionally graded gate dielectric sublayer and a continuous homogeneous gate dielectric sublayer according to the first embodiment of the present disclosure.

FIG. 6B is a vertical cross-sectional view of the first exemplary structure along the vertical plane B-B' of FIG. 6A.

FIG. 6C is a vertical cross-sectional view of the first exemplary structure along the vertical plane C-C' of FIG. 6A.

FIG. 7A is a top-down view of a region of the first exemplary structure after formation of a stack of a homogenous gate dielectric sublayer, a compositionally graded gate dielectric sublayer, and an active layer according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of a region of the first exemplary structure after formation of a compositionally graded semiconducting metal oxide region according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of a region of the first exemplary structure after formation of an electrode-level dielectric layer according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of a region of the first exemplary structure after formation of a source cavity, a drain cavity, and a bottom gate contact via cavity according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 11A is a top-down view of a region of the first exemplary structure after formation of a source electrode, a drain electrode, and a backside electrode contact via structure according to the first embodiment of the present disclosure.

FIG. 11B is a vertical cross-sectional view of the first exemplary structure along the vertical plane B-B' of FIG. 11A.

FIG. 11C is a vertical cross-sectional view of the first exemplary structure along the vertical plane C-C' of FIG. 11A.

FIG. 12A is a top-down view of a region of a second exemplary structure after formation of a top gate dielectric and a top gate electrode according to a second embodiment of the present disclosure.

FIG. 12B is a vertical cross-sectional view of the first exemplary structure along the vertical plane B-B' of FIG. 12A.

FIG. 12C is a vertical cross-sectional view of the first exemplary structure along the vertical plane C-C' of FIG. 12A.

FIG. 13A is a top-down view of a region of the second exemplary structure after formation of an electrode-level dielectric layer according to the second embodiment of the present disclosure.

FIG. 13B is a vertical cross-sectional view of the second exemplary structure along the vertical plane B-B' of FIG. 13A.

FIG. 13C is a vertical cross-sectional view of the second exemplary structure along the vertical plane C-C' of FIG. 13A.

FIG. 14A is a top-down view of a region of the second exemplary structure after formation of a source cavity, a drain cavity, a gate cavity, and a bottom gate contact via cavity according to the second embodiment of the present disclosure.

FIG. 14B is a vertical cross-sectional view of the second exemplary structure along the vertical plane B-B' of FIG. 14A.

FIG. 14C is a vertical cross-sectional view of the second exemplary structure along the vertical plane C-C' of FIG. 14A.

FIG. 15A is a top-down view of a region of a third exemplary structure after formation of a source electrode, a drain electrode, and a backside electrode contact via structure according to the second embodiment of the present disclosure.

FIG. 15B is a vertical cross-sectional view of the second exemplary structure along the vertical plane B-B' of FIG. 15A.

FIG. 15C is a vertical cross-sectional view of the second exemplary structure along the vertical plane C-C' of FIG. 15A.

FIG. 16A is a top-down view of a region of a third exemplary structure after formation of a bottom gate dielectric and an active layer according to the second embodiment of the present disclosure.

FIG. 16B is a vertical cross-sectional view of the second exemplary structure along the vertical plane B-B' of FIG. 16A.

FIG. 16C is a vertical cross-sectional view of the second exemplary structure along the vertical plane C-C' of FIG. 16A.

FIG. 17A is a top-down view of a region of the third exemplary structure after formation of a compositionally graded semiconducting metal oxide region according to the third embodiment of the present disclosure.

FIG. 17B is a vertical cross-sectional view of the third exemplary structure along the vertical plane B-B' of FIG. 17A.

FIG. 17C is a vertical cross-sectional view of the second exemplary structure along the vertical plane C-C' of FIG. 17A.

FIG. 18A is a top-down view of a region of the third exemplary structure after formation of an electrode-level dielectric layer and a source cavity, a drain cavity, a gate cavity, and a bottom gate contact via cavity according to the third embodiment of the present disclosure.

FIG. 18B is a vertical cross-sectional view of the third exemplary structure along the vertical plane B-B' of FIG. 18A.

FIG. 18C is a vertical cross-sectional view of the third exemplary structure along the vertical plane C-C' of FIG. 18A.

FIG. 19A is a top-down view of a region of the third exemplary structure after formation of a source electrode, a drain electrode, and a bottom gate contact via structure according to the third embodiment of the present disclosure.

FIG. 19B is a vertical cross-sectional view of the third exemplary structure along the vertical plane B-B' of FIG. 19A.

FIG. 19C is a vertical cross-sectional view of the third exemplary structure along the vertical plane C-C' of FIG. 19A.

FIG. 20A is a top-down view of a region of an alternative configuration of the third exemplary structure after formation of a source electrode, a drain electrode, and a bottom gate contact via structure according to the third embodiment of the present disclosure.

FIG. 20B is a vertical cross-sectional view of the third exemplary structure along the vertical plane B-B' of FIG. 20A.

FIG. 20C is a vertical cross-sectional view of the third exemplary structure along the vertical plane C-C' of FIG. 20A.

FIG. 21A is a top-down view of a region of a fourth exemplary structure after formation of a stack of a homogenous gate dielectric sublayer, a compositionally graded gate dielectric sublayer, and an active layer according to the fourth embodiment of the present disclosure.

FIG. 21B is a vertical cross-sectional view of the fourth exemplary structure along the vertical plane B-B' of FIG. 21A.

FIG. 21C is a vertical cross-sectional view of the fourth exemplary structure along the vertical plane C-C' of FIG. 21A.

FIG. 23A is a top-down view of a region of the fourth exemplary structure after formation of a source cavity, a drain cavity, a gate cavity, and a bottom gate contact via cavity according to the fourth embodiment of the present disclosure.

FIG. 23B is a vertical cross-sectional view of the fourth exemplary structure along the vertical plane B-B' of FIG. 23A.

FIG. 23C is a vertical cross-sectional view of the fourth exemplary structure along the vertical plane C-C' of FIG. 23A.

FIG. 24A is a top-down view of a region of the fourth exemplary structure after formation of a source electrode, a drain electrode, and a backside electrode contact via structure according to the fourth embodiment of the present disclosure.

FIG. 24B is a vertical cross-sectional view of the fourth exemplary structure along the vertical plane B-B' of FIG. 24A.

FIG. 24C is a vertical cross-sectional view of the fourth exemplary structure along the vertical plane C-C' of FIG. 24A.

FIG. 25A is a top-down view of a region of a fifth exemplary structure after formation of a top gate dielectric and a top gate electrode according to a fifth embodiment of the present disclosure.

FIG. 25B is a vertical cross-sectional view of the fifth exemplary structure along the vertical plane B-B' of FIG. 25A.

FIG. 25C is a vertical cross-sectional view of the fifth exemplary structure along the vertical plane C-C' of FIG. 25A.

FIG. 26A is a top-down view of a region of the fifth exemplary structure after formation of an electrode-level dielectric layer, a source cavity, a drain cavity, a gate cavity, and a bottom gate contact via cavity according to the fifth embodiment of the present disclosure.

FIG. 26B is a vertical cross-sectional view of the fifth exemplary structure along the vertical plane B-B' of FIG. 26A.

FIG. 26C is a vertical cross-sectional view of the fifth exemplary structure along the vertical plane C-C' of FIG. 26A.

FIG. 27A is a top-down view of a region of the fifth exemplary structure after formation of a source electrode, a drain electrode, and a backside electrode contact via structure according to the fifth embodiment of the present disclosure.

FIG. 27B is a vertical cross-sectional view of the fifth exemplary structure along the vertical plane B-B' of FIG. 27A.

FIG. 27C is a vertical cross-sectional view of the fifth exemplary structure along the vertical plane C-C' of FIG. 27A.

DETAILED DESCRIPTION

Figure 1:
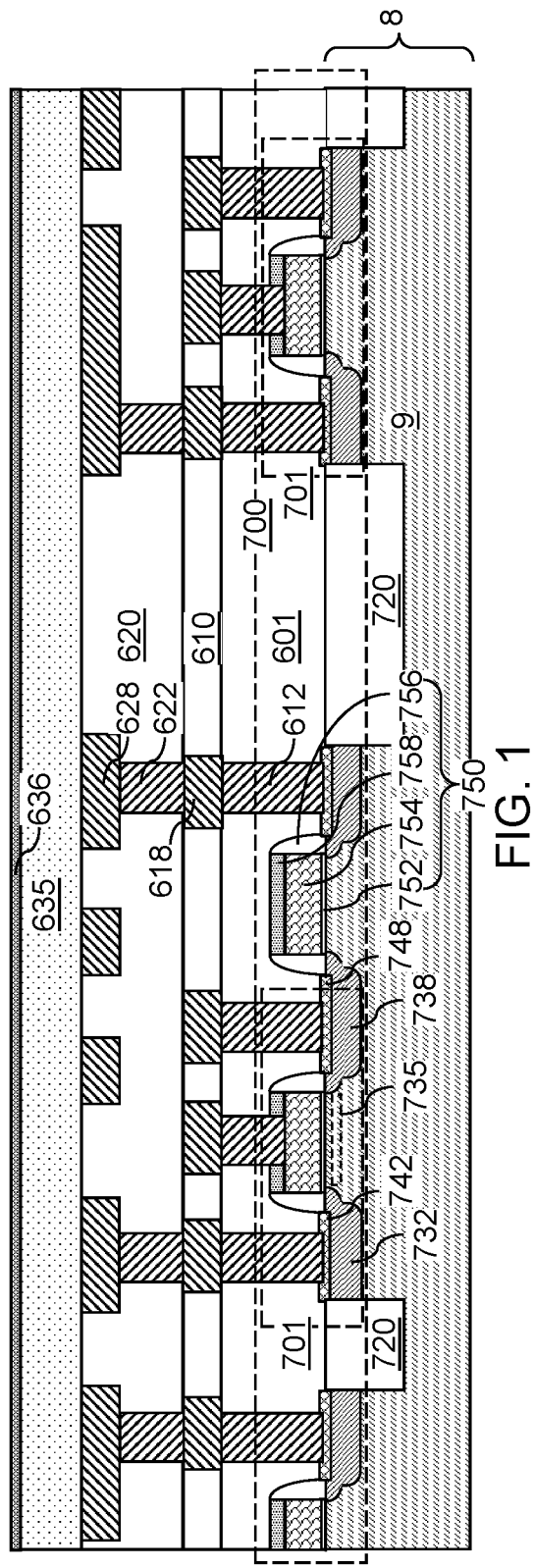
FIG. 1 is a vertical cross-sectional view of a first exemplary structure after formation of complementary metal-oxide-semiconductor (CMOS) transistors, first metal interconnect structures formed in lower-level dielectric layers, an insulating spacer layer, and an optional etch stop dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including at least one thin film transistor such as a plurality of thin film transistors. The thin film transistors may be formed over any substrate, which may be an insulating substrate, a conductive substrate, or a semiconducting substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The thin film transistors may be formed over the field effect transistors including single crystalline semiconductor channels and over the metal interconnect structures, which are herein referred to as lower-level metal interconnect structures.

According to an aspect of the present disclosure, at least one oxygen-saturated surface region may be formed in an active layer and/or a gate dielectric. The at least one oxygen-saturated surface region may be formed by oxidizing a surface region of the gate dielectric and/or by oxidizing a surface region of the active layer, which includes a polycrystalline semiconductor channel of a respective thin film transistor. The increase in the atomic concentration of oxygen atoms within the oxidized surface portion of the gate dielectric and/or within the oxidized surface portion of the active layer may retard diffusion of metallic elements (such as indium atoms) therethrough. Thus, the methods and structures of the present disclosure may prevent changes in the material composition within the active layers and deleterious properties in the transistor characteristics of the thin film transistors. The various aspects of embodiments of the present disclosure are described now in detail.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells is subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including active layers to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric layers may be subsequently formed over the substrate 8 and the semiconductor devices thereupon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect structures may include device contact via structures 612 formed in the first dielectric layer 601 and contact a respective component of the CMOS circuitry 700, first metal line structures 618 formed in the first interconnect-level dielectric layer 610, first metal via structures 622 formed in a lower portion of the second interconnect-level dielectric layer 620, and second metal line structures 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric layers (601, 610, 620) are herein referred to as lower-lower-level dielectric layers. The metal interconnect structures (612, 618, 622, 628) formed within in the lower-level dielectric layers are herein referred to as lower-level metal interconnect structures.

While the present disclosure is described using an embodiment in which thin film transistors are formed over the second interconnect-level dielectric layer 620, embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect structures that is formed within the lower-level dielectric layers (601, 610, 620) is herein referred to as first metal interconnect structures (612, 618, 622, 628). Generally, first metal interconnect structures (612, 618, 622, 628) formed within at least one lower-level dielectric layer (601, 610, 620) may be formed over the semiconductor material layer 9 that is located in the substrate 8.

According to an aspect of the present disclosure, thin film transistors (TFTs) may be subsequently formed in a metal interconnect level that overlies metal interconnect levels that contain the lower-level dielectric layers (601, 610, 620) and the first metal interconnect structures (612, 618, 622, 628). In one embodiment, a planar dielectric layer having a uniform thickness may be formed over the lower-level dielectric layers (601, 610, 620). The planar dielectric layer is herein referred to as an insulating spacer layer 635. The insulating spacer layer 635 includes a dielectric material such as undoped silicate glass, a doped silicate glass, organosilicate glass, or a porous dielectric material, and may be deposited by chemical vapor deposition. The thickness of the insulating spacer layer 635 may be in a range from 20 nm to 300 nm, although lesser and greater thicknesses may also be used.

Generally, interconnect-level dielectric layers (such as the lower-level dielectric layer (601, 610, 620)) containing therein the metal interconnect structures (such as the first metal interconnect structures (612, 618, 622, 628)) may be formed over semiconductor devices. The insulating spacer layer 635 may be formed over the interconnect-level dielectric layers.

In one embodiment, the substrate 8 may comprise a single crystalline silicon substrate, and lower-level dielectric layers (601, 610, 620) embedding lower-level metal interconnect structures (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating spacer layer 635. The etch stop dielectric layer 636 includes an etch stop dielectric material providing higher etch resistance to an etch chemistry during a subsequently anisotropic etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from 2 nm to 40 nm, such as from 4 nm to 20 nm, although lesser and greater thicknesses may also be used.

Referring to FIGS. 2A-2C, a region of the first exemplary structure is illustrated, which corresponds to an area in which a thin film transistor is to be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the insulating spacer layer 635 and the optional etch stop dielectric layer 636. The insulating layer 42 includes a dielectric material such as undoped silicate glass, a doped silicate glass, organosilicate glass, or a porous dielectric material, and may be deposited by chemical vapor deposition. Other dielectric materials are within the contemplated scope of disclosure. The thickness of the insulating layer 42 may be in a range from 20 nm to 300 nm, although lesser and greater thicknesses may also be used. Multiple thin film transistors may be subsequently formed over the insulating layer 42. In one embodiment, the multiple thin film transistors may be arranged along a first horizontal direction hd1 and a second horizontal direction hd2, which may be perpendicular to the first horizontal direction hd1.

Referring to FIGS. 3A-3C, a photoresist layer (not shown) may be applied over a top surface of the insulating layer 42, and may be lithographically patterned to form an opening within the illustrated area. In one embodiment, the opening may be a rectangular opening having a pair of widthwise sidewalls along the first horizontal direction and having a pair of lengthwise sidewalls along the second horizontal direction hd2. An anisotropic etch process may be performed to transfer the pattern of the openings in the photoresist layer into an upper portion of the insulating layer 42. A recess region 11 may be formed in an upper portion of the insulating layer 42. The recess region 11 is also referred to as a bottom gate trench.

In one embodiment, the width of the recess region 11 along the first horizontal direction hd1 may be in a range from 20 nm to 300 nm, although lesser and greater widths may also be used. In one embodiment, the length of the recess region 11 along the second horizontal direction hd2 may be in a range from 30 nm to 3,000 nm, although lesser and greater lengths may also be used. The depth of the recess region 11 may be the same as the thickness of the insulating layer 42. Thus, a top surface of the optional etch stop dielectric layer 636 or a top surface of the insulating spacer layer 635 (in embodiments in which the etch stop dielectric layer 636 is not used) may be exposed in recess region 11. The photoresist layer may be subsequently removed, for example, by ashing.

Referring to FIGS. 4A-4C, at least one conductive material may be deposited in the recess region 11. The at least one conductive material may include, for example, a metallic barrier liner material (such as TiN, TaN, and/or WN; not explicitly shown) and a metallic fill material (such as Cu, W, Mo, Co, Ru, etc.; not explicitly shown). Other suitable metallic liner and metallic fill materials within the contemplated scope of disclosure may also be used. Excess portions of the at least one conductive material may be removed from above the horizontal plane including the top surface of the insulating layer 42 by a planarization process, which may include a chemical mechanical polishing (CMP) process and/or a recess etch process. The planarization process may use a chemical mechanical polishing process or a recess etch process. A bottom gate electrode 15 may be formed in the recess region 11. The bottom gate electrode 15 may be the only electrode of a thin film transistor to be subsequently formed, or may be one of two gate electrodes of a thin film transistor in embodiments in which a top gate electrode is subsequently formed. The top surface of the bottom gate electrode 15 may be located within a same horizontal plane as the top surface of the insulating layer 42.

Referring to FIGS. 5A-5C, a continuous gate dielectric layer 210C may be deposited over the insulating layer 42 and the bottom gate electrode 15 as a continuous material layer. In some embodiments, the gate dielectric layer 210C is a continuous homogeneous gate dielectric layer. The continuous gate dielectric layer 210C may be formed by deposition of at least one gate dielectric material. The gate dielectric material may include a dielectric metal oxide layer (such as aluminum oxide, titanium oxide, yttrium oxide, zirconium oxide, lanthanum oxide, hafnium oxide, tantalum oxide, a compound thereof, etc.) or a stack of multiple dielectric metal oxide layers (not explicitly shown). Other gate dielectric materials may be within the contemplated scope of disclosure. The gate dielectric material may be deposited by atomic layer deposition or chemical vapor deposition. In one embodiment, the gate dielectric material of the continuous gate dielectric layer 210C may be deposited as a homogeneous dielectric oxide material having an oxygen deficiency. For example, the atomic concentration of oxygen atoms within the gate dielectric material of the continuous gate dielectric layer 210C may be in a range from 90% to 99.9%, such as from 95% to 99.7% of the atomic concentration of oxygen atoms that is necessary to provide coordination of all metallic elements within the gate dielectric material of the continuous gate dielectric layer 210C. In other words, the oxygen deficiency within the gate dielectric material of the continuous gate dielectric layer 210C may be in a range from 0.1% to 10%, such as from 0.3% to 5%, although lesser and greater oxygen deficiencies may also be used. The thickness of the continuous gate dielectric layer 210C may be in a range from 1.5 nm to 12 nm, such as from 2 nm to 6 nm, although lesser and greater thicknesses may also be used.

Referring to FIGS. 6A-6C, a top surface portion of the continuous gate dielectric layer 210C may be oxidized by introducing oxygen atoms therein. In one embodiment, the introduction of the oxygen atoms may be performed by a first thermal anneal process performed at an elevated temperature in an oxygen-containing environment. The first thermal anneal process may use, for example, a furnace anneal process. The oxygen-containing environment may include at least one oxygen source gas at a partial pressure in a range from 1 mTorr to 760 Torr, such as from 10 mTorr, to 100 Torr. The oxygen-containing source gas may include, for example, $O_2$, $O_3$, $NO_2$, NO, $H_2O$, or a combination thereof. An inert gas such as argon may, or may not, be used during the first thermal anneal process. The elevated temperature may be in a range from 300 degrees Celsius to 425 degrees Celsius, and the duration of the first thermal anneal process may be in a range from 1 minute to 1 hour, although lesser and greater durations may also be used.

In another embodiment, the introduction of the oxygen atoms may be performed by a first plasma oxidation process using an oxygen-containing plasma generated from an oxygen-containing source gas. The oxygen-containing source gas may include, for example, $O_2$, $O_3$, $NO_2$, NO, $H_2O$, or a combination thereof.

The top surface portion of the continuous gate dielectric layer 210C into which additional oxygen atoms are provided may be converted into a continuous compositionally graded gate dielectric sublayer 12C. The underlying portion of the continuous gate dielectric layer 210C in which the atomic concentration of oxygen atoms is not increased has a homogeneous material composition, and is herein referred to as a continuous homogeneous gate dielectric sublayer 10C. In one embodiment, the surface oxygen concentration in the continuous gate dielectric layer 210C may be increased by introducing oxygen atoms into a surface region of the continuous gate dielectric layer 210C.

Generally, the atomic concentration of oxygen atoms is the highest at the top surface of the continuous compositionally graded gate dielectric sublayer 12C, and decreases gradually with a downward distance from the horizontal plane including the top surface of the continuous compositionally graded gate dielectric sublayer 12C. Thus, the compositionally-graded gate dielectric material within the continuous compositionally graded gate dielectric sublayer 12C has a vertical compositional gradient such that an atomic concentration of oxygen atoms within the continuous compositionally graded gate dielectric sublayer 12C decreases with a vertical distance downward from the horizontal plane including the top surface of the continuous compositionally graded gate dielectric sublayer 12C.

In one embodiment, the compositionally-graded gate dielectric material of the continuous compositionally graded gate dielectric sublayer 12C comprises, and/or consists essentially of, a compositionally-graded dielectric metal oxide material. In one embodiment, the compositionally-graded dielectric metal oxide material of the continuous compositionally graded gate dielectric sublayer 12C is selected from aluminum oxide, titanium oxide, yttrium oxide, zirconium oxide, lanthanum oxide, hafnium oxide, tantalum oxide, a compound thereof, and a layer stack thereof. In one embodiment, the oxygen concentration gradient may be formed within the entire volume of the continuous gate dielectric layer 210C. In this embodiment, the volume of the continuous homogeneous gate dielectric sublayer 10C becomes zero (i.e., the continuous homogeneous gate dielectric sublayer 10C disappears), and the entirety of the continuous gate dielectric layer 210C may be converted into the continuous compositionally graded gate dielectric sublayer 12C. A combination of the optional continuous homogeneous gate dielectric sublayer 10C and the continuous compositionally graded gate dielectric sublayer 12C constitutes a continuous gate dielectric layer (10C, 12C).

Referring to FIGS. 7A-7C, an active layer 20 may be formed over the continuous compositionally graded gate dielectric sublayer 12C. In some embodiments, the active layer 20 can be a semiconducting metal oxide layer. In one embodiment, the semiconducting material includes a material providing electrical conductivity in a range from 1.0 S/m to $1.0 \times 10^5$ S/m upon suitable doping with electrical dopants (which may be p-type dopants or n-type dopants). Exemplary semiconducting materials that may be used for the semiconducting metal oxide layer include, but are not limited to, indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. Other suitable semiconducting materials are within the contemplated scope of disclosure. In one embodiment, the semiconducting material of the continuous semiconducting metal oxide layer may include indium gallium zinc oxide.

The active layer 20 may include a polycrystalline semiconducting material, or an amorphous semiconducting material that may be subsequently annealed into a polycrystalline semiconducting material having a greater average grain size. The active layer 20 may be formed by deposition and patterning of a continuous semiconducting metal oxide layer. For example, the continuous semiconducting metal oxide layer may be deposited by physical vapor deposition although other suitable deposition processes may be used. The thickness of the continuous semiconducting metal oxide layer may be in a range from 1 nm to 100 nm, such as from 2 nm to 50 nm and/or from 4 nm to 15 nm, although lesser and greater thicknesses may also be used.

A photoresist layer 27 may be applied over the continuous semiconducting metal oxide layer, and may be lithographically patterned to form discrete patterned photoresist material portions straddling a respective bottom gate electrode 15 along the first horizontal direction hd1. In one embodiment, each patterned portion of the photoresist layer may have a horizontal cross-sectional shape of a rectangle or a rounded rectangle. The pattern in the photoresist layer 27 may be transferred through the continuous semiconducting metal oxide layer, the continuous compositionally graded gate dielectric sublayer 12C, and the continuous homogeneous gate dielectric sublayer 10C by performing an anisotropic etch process. Each patterned portion of the continuous semiconducting metal oxide layer comprises an active layer 20. Each patterned portion of the compositionally graded gate dielectric sublayer 12C comprises a compositionally graded gate dielectric sublayer 12. Each patterned portion of the continuous homogeneous gate dielectric sublayer 10C comprises a homogeneous gate dielectric sublayer 10. A stack of the homogeneous gate dielectric sublayer 10 and the compositionally graded gate dielectric sublayer 12 constitutes a bottom gate dielectric 110. The bottom gate dielectric 110 may be formed over, and directly on, the bottom gate electrode 15 and the insulating layer 42. The active layer 20 may be formed over the bottom gate electrode 15. The photoresist layer 27 may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used. Generally, a vertical stack of a bottom gate electrode 15, a bottom gate dielectric 110, and an active layer 20 may be formed over lower-level dielectric layers (601, 610, 620) that overlies a substrate 8. The sidewalls of the bottom gate dielectric 110, and the active layer 20 may be vertically coincident, i.e., may be located within same vertical planes.

Referring to FIGS. 8A-8C, surface portions of the active layer 20 may be oxidized by introducing oxygen atoms therein. In one embodiment, the oxygen atoms may be introduced by a second thermal anneal process performed at an elevated temperature in an oxygen-containing environment. The second thermal anneal process may use, for example, a furnace anneal process. The oxygen-containing environment may include at least one oxygen source gas at a partial pressure in a range from 1 mTorr to 760 Torr, such as from 10 mTorr to 100 Torr. The oxygen-containing source gas may include, for example, $O_2$, $O_3$, $NO_2$, NO, $H_2O$, or a combination thereof. An inert gas such as argon may, or may not, be used during the second thermal anneal process. The elevated temperature may be in a range from 300 degrees Celsius to 425 degrees Celsius, and the duration of the second thermal anneal process may be in a range from 1 minute to 1 hour, although lesser and greater durations may also be used.

During the second thermal anneal process, the oxygen atoms may diffuse from the top surface region of the bottom gate dielectric 110 into a bottom surface portion 20B of the active layer 20. In this embodiment, the bottom surface portion 20B of the active layer 20 may have a compositional gradient such that the atomic concentration of oxygen atoms decreases with a vertical distance away from the interface with the bottom gate dielectric 110. In one embodiment, the bottom gate dielectric 110 comprises a compositionally-graded gate dielectric material (within the compositionally graded gate dielectric sublayer 12) in which an atomic concentration of oxygen atoms within the bottom gate dielectric 110 decreases with a vertical distance downward from an interface between the bottom gate dielectric 110 and the active layer 20, and the bottom surface portion 20B of the active layer 20 has a compositional gradient such that an atomic concentration of oxygen atoms decreases with a vertical distance upward from the interface with the bottom gate dielectric 110 at least to 20% of a vertical thickness t of the active layer 20.

In another embodiment, the introduction of the oxygen atoms may be performed by a second plasma oxidation process using an oxygen-containing plasma generated from an oxygen-containing source gas. The oxygen-containing source gas may include, for example, $O_2$, $O_3$, $NO_2$, NO, $H_2O$, or a combination thereof.

The surface portions of the active layer 20 into which additional oxygen atoms are provided may be converted into a compositionally graded semiconducting metal oxide region 20G. The underlying portion of the active layer 20 in which the atomic concentration of oxygen atoms is not increased has a homogeneous material composition, and is herein referred to as a homogeneous semiconducting metal oxide region 20H. A bottom surface portion 20B of the active layer 20 may have a compositional gradient such that the atomic concentration of oxygen decreases with a vertical distance away from the interface with the bottom gate dielectric 110. In one embodiment, the surface oxygen concentration in the active layer 20 may be increased by introducing oxygen atoms into the surface regions of the active layer 20.

Generally, the atomic concentration of oxygen atoms is the highest at the physically exposed surfaces of the compositionally graded semiconducting metal oxide region 20G, and decreases gradually with a distance from the physically exposed surfaces of the compositionally graded semiconducting metal oxide region 20G. Thus, the compositionally-graded gate dielectric material within a horizontally-extending portion of the compositionally graded semiconducting metal oxide region 20G has a vertical compositional gradient such that an atomic concentration of oxygen atoms within the horizontally-extending portion of the compositionally graded semiconducting metal oxide region 20G decreases with a vertical distance downward from the horizontal plane including the top surface of the compositionally graded semiconducting metal oxide region 20G. The compositionally-graded gate dielectric material within vertically-extending portions of the compositionally graded semiconducting metal oxide region 20G has a lateral compositional gradient such that an atomic concentration of oxygen atoms within the vertically-extending portions of the compositionally graded semiconducting metal oxide region 20G decreases with a lateral distance from a respective sidewall of the compositionally graded semiconducting metal oxide region 20G.

In one embodiment, the compositionally-graded gate dielectric material of the compositionally graded semiconducting metal oxide region 20G comprises, and/or consists essentially of, a compositionally-graded semiconducting metal oxide material. In one embodiment, the compositionally-graded semiconducting metal oxide material of the compositionally graded semiconducting metal oxide region 20G is selected from indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. A combination of the homogeneous semiconducting metal oxide region 20H, the compositionally graded semiconducting metal oxide region 20G, and a bottom surface portion 20B constitutes an active layer 20.

Figure 8D:
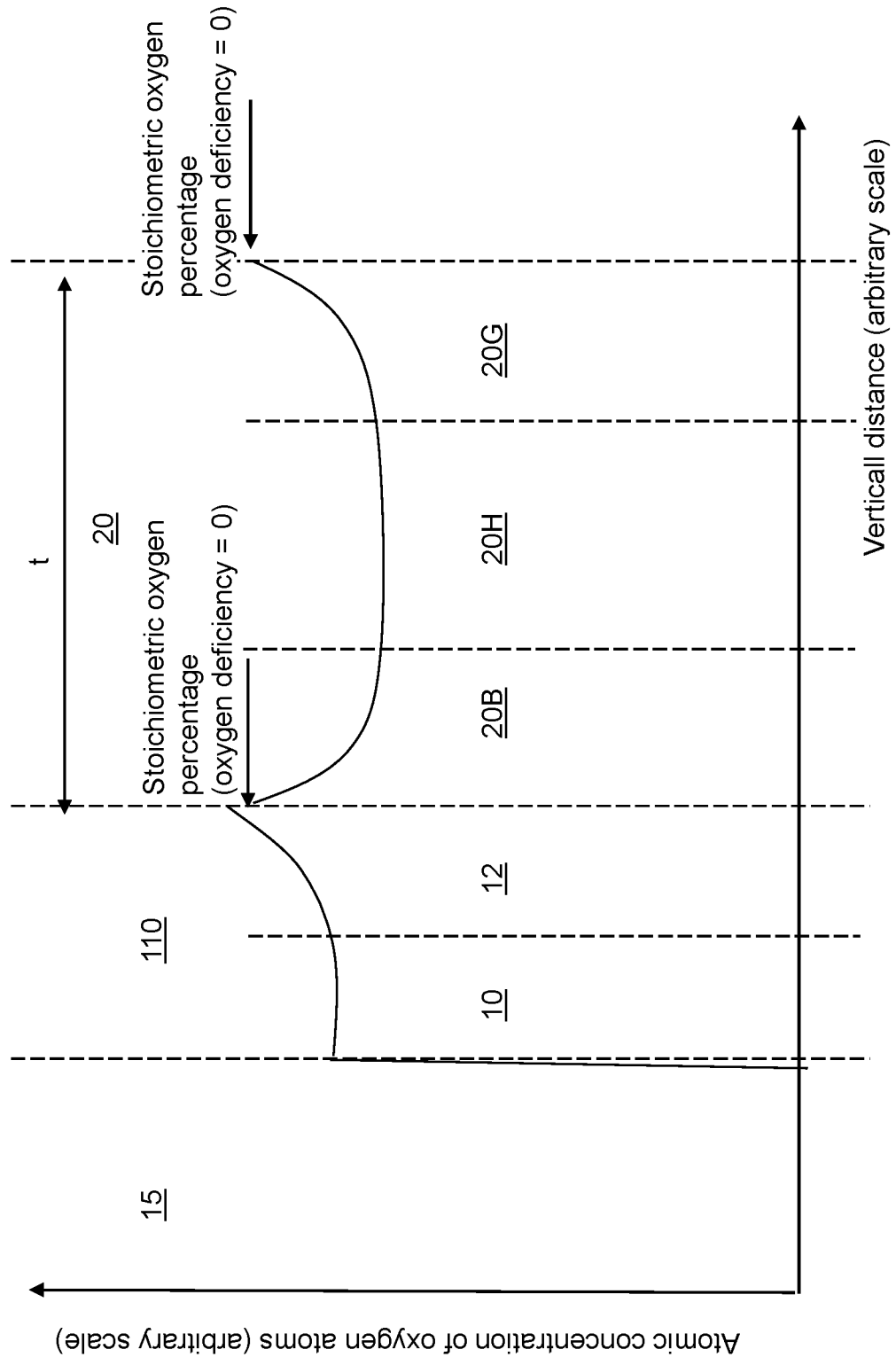
FIG. 8D illustrates an exemplary vertical atomic concentration profile of oxygen atoms within a stack including a bottom gate electrode, a bottom gate dielectric, and an active layer in the first exemplary structure of FIGS. 8A-8C according to an aspect of the present disclosure.

FIG. 8D illustrates an exemplary vertical atomic concentration profile of oxygen atoms within a stack including a bottom gate electrode 15, a bottom gate dielectric 110, and an active layer 20. A surface oxygen concentration may be increased in at least one of a gate dielectric (such as a bottom gate dielectric 110) and an active layer 20 by introducing oxygen atoms into a surface region of a respective one of the gate dielectric (such as the bottom gate dielectric 110) and the active layer 20.

Generally, oxygen atoms may be introduced into the top surface portion of the active layer 20 by performing a surface oxidation process selected from a plasma oxidation process using an oxygen-containing plasma, and a thermal anneal process in an oxygen-containing ambient. In this embodiment, the top surface portion of the active layer 20 (which is a horizontally-extending region of the compositionally graded semiconducting metal oxide region 20G) has a compositional gradient such that an atomic concentration of oxygen atoms decreases with a vertical distance downward from a horizontal plane including the top surface of the active layer at least to 20% of a vertical thickness t of the active layer 20.

In an illustrative example, the active layer 20 comprises an indium gallium zinc oxide material, and oxygen deficiency within the active layer 20 increases with the vertical distance downward from the horizontal plane including the top surface of the active layer at least to 20% of the vertical thickness t of the active layer 20. In one embodiment, sidewall surface portions of the active layer 20 (which are vertically-extending region of the compositionally graded semiconducting metal oxide region 20G) have a lateral compositional gradient such that an atomic concentration of oxygen atoms decreases with a lateral distance inward from a respective sidewall of the active layer 20. The bottom gate dielectric 110 comprises a compositionally-graded gate dielectric material (within the compositionally graded gate dielectric sublayer 12) in which an atomic concentration of oxygen atoms within the bottom gate dielectric 110 decreases with a vertical distance downward from an interface between the bottom gate dielectric 110 and the active layer 20. The amount of oxygen atoms that diffuse from the top surface of the compositionally graded gate dielectric sublayer 12 into the bottom surface portion 20B of the active layer 20 decreases with a distance from the interface between the bottom gate dielectric 110 and the active layer 20. As such, the bottom surface portion 20B of the active layer 20 has a compositional gradient such that an atomic concentration of oxygen atoms decreases with a vertical distance upward from the interface at least to 20% of a vertical thickness t of the active layer 20.

In one embodiment, the active layer 20 comprises a compound semiconductor material including at least two metallic elements (such as indium, gallium, and zinc) and oxygen. In one embodiment, the active layer 20 comprises, and/or consists essentially of, an indium gallium zinc oxide material, and oxygen deficiency within the active layer 20 increases with the vertical distance upward from the interface with the bottom gate dielectric 110 at least to 20% of the vertical thickness t of the active layer 20.

The peak atomic concentration of oxygen atoms within the active layer 20 may occur at the physically exposed surfaces of the compositionally graded semiconducting metal oxide region 20G. In embodiments in which the bottom gate dielectric 110 comprises the compositionally graded gate dielectric sublayer 12, the peak atomic concentration of oxygen atoms within the active layer 20 may occur at the bottom surface portion 20B of the active layer 20 that contacts a top surface of the compositionally graded gate dielectric sublayer 12. In this embodiment, the material composition of the active layer 20 may be stoichiometric (i.e., may have zero oxygen deficiency) at the physically exposed surfaces and at an interface with the compositionally graded gate dielectric sublayer 12.

Referring to FIGS. 9A-9C, a dielectric layer 48 may be deposited over the active layer 20, the bottom gate electrode 15, and the insulating layer 41. The dielectric layer 48 is also referred to as an electrode-level dielectric layer. The dielectric layer 48 includes a dielectric material such as undoped silicate glass, a doped silicate glass, organosilicate glass, or a stack thereof. Other dielectric materials are within the contemplated scope of disclosure. Optionally, the dielectric layer 48 may be planarized to provide a flat top surface. The dielectric material of the dielectric layer 48 may be planarized so that a planarized horizontal top surface of the dielectric layer 48 is formed within the horizontal plane including the top surface of the top gate electrode 34. The thickness of the insulating layer 42, as measured above the active layer 20, may be in a range from 50 nm to 500 nm, such as from 100 nm to 250 nm, although lesser and greater thicknesses may also be used. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 10A-10C, a photoresist layer (not shown) may be applied over the TFT-level dielectric layer 40, and may be lithographically patterned to form discrete openings therein. The pattern of the discrete openings in the photoresist layer may be transferred through the dielectric layer 48 and the top gate dielectric 30 by at least one etch process to form a source cavity 51, a drain cavity 59, and a bottom gate contact via cavity 19. The at least one etch process may comprise a first anisotropic etch process that etches the material of the dielectric layer 48 selective to the material of the top gate dielectric 30, and an isotropic etch process or a second anisotropic etch process that etches the material of the top gate dielectric 30 selective to the material of active layer 20.

The source cavity 51 and the drain cavity 59 may be formed at opposite ends of the active layer 20, and may be laterally spaced from each other along the first horizontal direction hd1. In one embodiment, an end sidewall of the active layer 20 laterally extending along the second horizontal direction hd2 and a pair of sidewall segments of the active layer 20 laterally extending along the first horizontal direction hd1 may be physically exposed at the bottom of each of the source cavity 51 and the drain cavity 59. A rectangular portion of the top surface of the active layer 20 may be physically exposed at the bottom of each of the source cavity 51 and the drain cavity 59. A top surface of the bottom gate electrode 15 may be physically exposed at the bottom of the backside electrode contact via cavity 19. The photoresist layer may be subsequently removed, for example, by ashing.

Referring to FIGS. 11A-11C, at least one conductive material may be deposited in the cavities (51, 19, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The metallic fill material may include W, Cu, Al, Co, Ru, Mo, Ta, Ti, alloys thereof, and/or combinations thereof. Other suitable metallic liner materials and metallic fill materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56. Each remaining portion of the at least one conductive material filling a backside electrode contact via cavity 19 constitutes a backside electrode contact via structure 18, which contacts a top surface of the bottom gate electrode 15.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. Each backside electrode contact via structure 18 may include a bottom gate contact metallic liner 16 that is a remaining portion of the metallic liner material, and a bottom gate contact metallic fill material portion 17 that is a remaining portion of the metallic fill material.

The active layer 20 and a set of electrode structures (52, 15, 56) may be formed within a TFT-level dielectric layer 40. Top surfaces of the source electrode 52, the drain electrode 56, and the bottom gate electrode contact structure 18 may be located within (i.e., may be co-planar with) a horizontal plane including a top surface of the TFT-level dielectric layer 40. Generally, the source electrode 52 and the drain electrode 56 may be formed directly on end portions of the active layer 20.

Generally, the insulating layer 42 embeds a gate electrode (such as the bottom gate electrode 15) and overlies a substrate 8. A stack of a gate dielectric (such as a bottom gate dielectric 110) and an active layer 20 overlies the gate electrode (such as the bottom gate electrode 15). A source electrode 52 and a drain electrode 56 contacting a respective portion of a top surface of the active layer 20 may be formed.

Referring to FIGS. 12A-12C, a second exemplary structure according to a second embodiment of the present disclosure may be derived from the first exemplary structure of FIGS. 8A-8C by forming a top gate dielectric 30 and a top gate electrode 35. Generally, a top gate dielectric layer and a top gate electrode material layer may be deposited over the active layer 20. The top gate dielectric layer may comprise any material that may be used for the continuous homogeneous gate dielectric sublayer 10C, and may have a thickness in a range from 1.5 nm to 12 nm, such as from 2 nm to 6 nm, although lesser and greater thicknesses may also be used. The top gate electrode material layer includes at least one conductive material, which may be any material that may be used for the bottom gate electrode 15. The thickness of the top gate electrode material layer may be in a range from 50 nm to 300 nm, such as from 100 nm to 200 nm, although lesser and greater thicknesses may also be used.

A photoresist layer (not shown) may be applied over the top gate electrode material layer, and may be lithographically patterned to form discrete photoresist material portions. The pattern in the photoresist material portions may be transferred through the top gate electrode material layer and the top gate dielectric layer by performing an anisotropic etch process, which may be selective to the material of the active layer 20. Each patterned portion of the top gate electrode material layer constitutes a top gate electrode 35. Each patterned portion of the top gate dielectric layer constitutes a top gate dielectric 30. The photoresist layer may be subsequently removed, for example, by ashing. The top gate electrode 35 straddles the active layer 20 along the second horizontal direction hd2. The top gate dielectric 30 contacts a portion of a top surface of the active layer 20, such as a top surface of the compositionally graded semiconducting metal oxide region 20G. The top gate electrode 35 overlies, and contacts, the top gate dielectric 30.

Referring to FIGS. 13A-13C, the processing steps of FIGS. 9A-9C may be performed to form a dielectric layer 48. The dielectric material of the dielectric layer 48 may be planarized so that a planarized horizontal top surface of the dielectric layer 48 is formed within the horizontal plane including the top surface of the top gate electrode 35. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 14A-14C, the processing steps of FIGS. 10A-10C may be performed to form a source cavity 51, a drain cavity 59, and a backside electrode contact via cavity 19 through the dielectric layer 48.

Referring to FIGS. 15A-15C, the processing steps of FIGS. 11A-11C may be performed to form a source electrode 52, a drain electrode 56, and a backside electrode contact via structure 18. The active layer 20 and a set of electrode structures (52, 15, 35, 56) may be formed within a TFT-level dielectric layer 40. Top surfaces of the source electrode 52, the drain electrode 56, the top gate electrode 35, and the bottom gate electrode contact structure 18 may be located within (i.e., may be co-planar with) a horizontal plane including a top surface of the TFT-level dielectric layer 40.

Referring to FIGS. 16A-16C, a third exemplary structure according to the second embodiment of the present disclosure may be derived from the first exemplary structure of FIGS. 5A-5C by forming a continuous semiconducting metal oxide layer, forming a patterned photoresist layer 27 over the continuous semiconducting metal oxide layer, and by transferring the pattern in the photoresist layer 27 through the continuous semiconducting metal oxide layer and the continuous gate dielectric layer 210C. The continuous semiconducting metal oxide layer may have the same thickness and the same material composition as in the first embodiment. Thus, the continuous semiconducting metal oxide layer may have any material composition as the active layer 20 in the first exemplary structure of FIGS. 7A-7C. The pattern in the photoresist layer 27 may be the same as in the first embodiment. The transfer of the pattern in the photoresist layer 27 through the continuous semiconducting metal oxide layer and the continuous gate dielectric layer 210C may be performed using at least one anisotropic etch process. Each patterned portion of the continuous semiconducting metal oxide layer comprises an active layer 20. Each patterned portion of the continuous gate dielectric layer 210C constitutes a bottom gate dielectric 210. The photoresist layer 27 may be subsequently removed, for example, by an ashing process. In one embodiment, the entirety of the bottom gate dielectric 210 may have a homogeneous material composition.

Referring to FIGS. 17A-17C, the processing steps of FIGS. 8A-8C may be performed. Thus, surface portions of the active layer 20 may be oxidized by introducing oxygen atoms therein. In one embodiment, the introduction of the oxygen atoms may be performed by a thermal anneal process performed at an elevated temperature in an oxygen-containing environment, which may be the same as the second thermal anneal process described above. In another embodiment, the introduction of the oxygen atoms may be performed by a plasma oxidation process, which may be the same as the second plasma oxidation process described above.

The surface portions of the active layer 20 into which additional oxygen atoms are provided are converted into a compositionally graded semiconducting metal oxide region 20G. The underlying portion of the active layer 20 in which the atomic concentration of oxygen atoms is not increased has a homogeneous material composition, and is herein referred to as a homogeneous semiconducting metal oxide region 20H. In one embodiment, the surface oxygen concentration in the active layer 20 may be increased by introducing oxygen atoms into the surface regions of the active layer 20.

Generally, the atomic concentration of oxygen atoms is the highest at the physically exposed surfaces of the compositionally graded semiconducting metal oxide region 20G, and decreases gradually with a distance from the physically exposed surfaces of the compositionally graded semiconducting metal oxide region 20G. Thus, the compositionally-graded gate dielectric material within a horizontally-extending portion of the compositionally graded semiconducting metal oxide region 20G has a vertical compositional gradient such that an atomic concentration of oxygen atoms within the horizontally-extending portion of the compositionally graded semiconducting metal oxide region 20G decreases with a vertical distance downward from the horizontal plane including the top surface of the compositionally graded semiconducting metal oxide region 20G. The compositionally-graded gate dielectric material within vertically-extending portions of the compositionally graded semiconducting metal oxide region 20G has a lateral compositional gradient such that an atomic concentration of oxygen atoms within the vertically-extending portions of the compositionally graded semiconducting metal oxide region 20G decreases with a lateral distance from a respective sidewall of the compositionally graded semiconducting metal oxide region 20G.

In one embodiment, the compositionally-graded gate dielectric material of the compositionally graded semiconducting metal oxide region 20G comprises, and/or consists essentially of, a compositionally-graded semiconducting metal oxide material. In one embodiment, the compositionally-graded semiconducting metal oxide material of the compositionally graded semiconducting metal oxide region 20G is selected from indium gallium zinc oxide (IGZO), indium tungsten oxide, indium zinc oxide, indium tin oxide, gallium oxide, indium oxide, doped zinc oxide, doped indium oxide, doped cadmium oxide, and various other doped variants derived therefrom. A combination of the homogeneous semiconducting metal oxide region 20H and the compositionally graded semiconducting metal oxide region 20G constitutes an active layer 20.

Figure 17D:
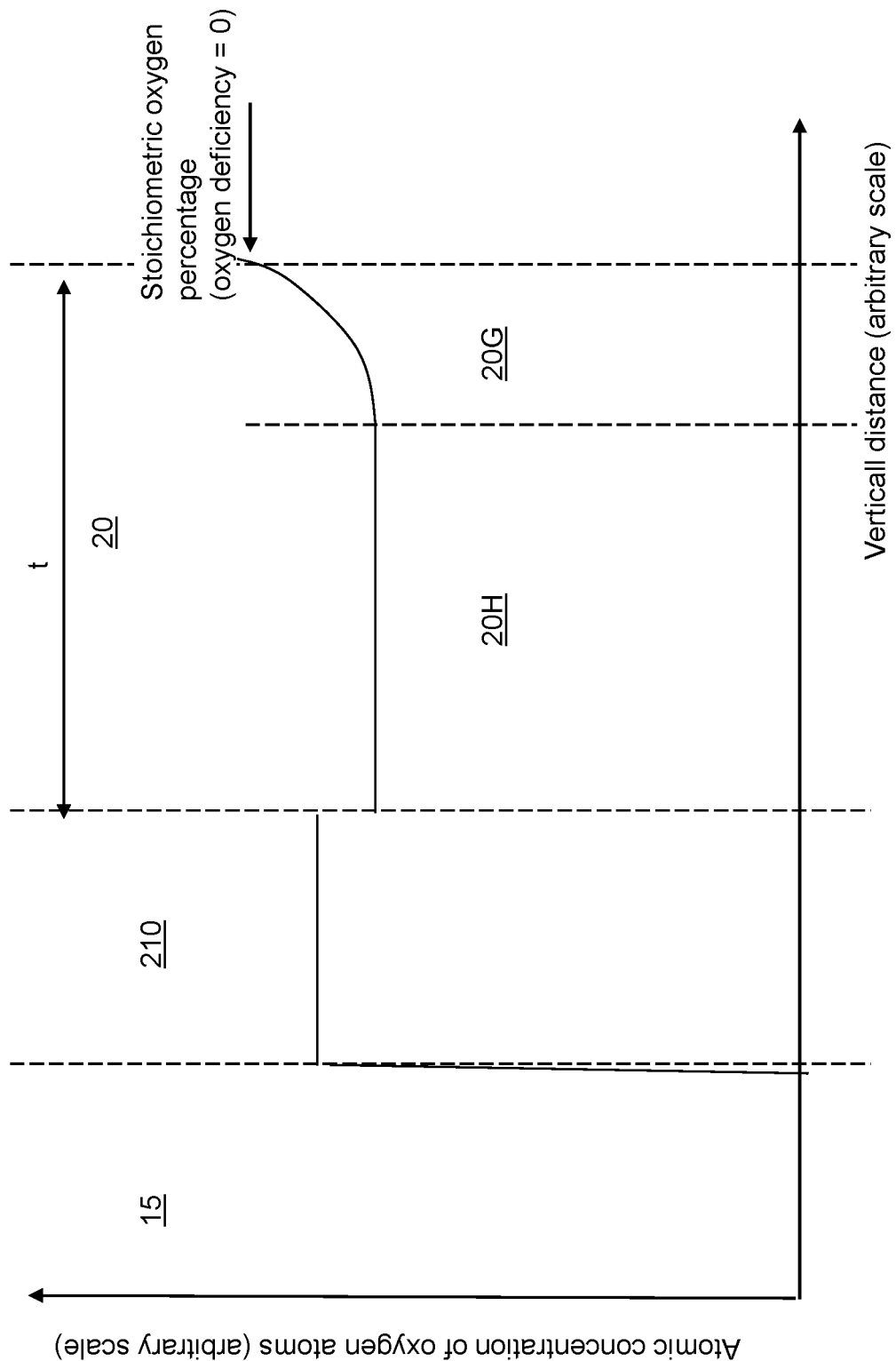
FIG. 17D illustrates an exemplary vertical atomic concentration profile of oxygen atoms within a stack including a bottom gate electrode, a bottom gate dielectric, and an active layer in the first exemplary structure of FIGS. 17A-17C according to an aspect of the present disclosure.

FIG. 17D illustrates an exemplary vertical atomic concentration profile of oxygen atoms within a stack including a bottom gate electrode 15, a bottom gate dielectric 210, and an active layer 20. A surface oxygen concentration may be increased in the active layer 20 by introducing oxygen atoms into a surface region of the active layer 20.

Generally, oxygen atoms may be introduced into the top surface portion of the active layer 20 by performing a surface oxidation process selected from a plasma oxidation process using an oxygen-containing plasma, and a thermal anneal process in an oxygen-containing ambient. In this embodiment, the top surface portion of the active layer 20 (which is a horizontally-extending region of the compositionally graded semiconducting metal oxide region 20G) has a compositional gradient such that an atomic concentration of oxygen atoms decreases with a vertical distance downward from a horizontal plane including the top surface of the active layer at least to 20% of a vertical thickness t of the active layer 20.

In an illustrative example, the active layer 20 comprises an indium gallium zinc oxide material, and oxygen deficiency within the active layer 20 increases with the vertical distance downward from the horizontal plane including the top surface of the active layer at least to 20% of the vertical thickness t of the active layer 20. In one embodiment, sidewall surface portions of the active layer 20 (which are vertically-extending region of the compositionally graded semiconducting metal oxide region 20G) have a lateral compositional gradient such that an atomic concentration of oxygen atoms decreases with a lateral distance inward from a respective sidewall of the active layer 20.

The peak atomic concentration of oxygen atoms within the active layer 20 may occur at the physically exposed surfaces of the compositionally graded semiconducting metal oxide region 20G. In this embodiment, the material composition of the active layer 20 may be stoichiometric (i.e., may have zero oxygen deficiency) at the physically exposed surfaces.

Referring to FIGS. 18A-18C, the processing steps of FIGS. 10A-10C may be performed to form a source cavity 51, a drain cavity 59, and a backside electrode contact via cavity 19 through the dielectric layer 48.

Referring to FIGS. 19A-19C, the processing steps of FIGS. 11A-11C may be performed to form a source electrode 52, a drain electrode 56, and a backside electrode contact via structure 18. The active layer 20 and a set of electrode structures (52, 15, 56) may be formed within a TFT-level dielectric layer 40. Top surfaces of the source electrode 52, the drain electrode 56, and the bottom gate electrode contact structure 18 may be located within (i.e., may be co-planar with) a horizontal plane including a top surface of the TFT-level dielectric layer 40.

Referring to FIGS. 20A-20C, an alternative configuration of the third exemplary structure is illustrated, which may be derived from the third exemplary structure by forming a stack of a top gate dielectric 30 and a top gate electrode 35. The processing steps of FIGS. 12A-12C may be performed after the processing steps of FIGS. 17A-17C to form a stack of the top gate dielectric 30 and the top gate electrode 35. Subsequently, the processing steps of FIGS. 18A-19C may be performed to form the alternative configuration of the third exemplary structure illustrated in FIGS. 20A-20C.

Referring to FIGS. 21A-21C, a fourth exemplary structure according to fourth embodiment of the present disclosure may be derived from the first exemplary structure of FIGS. 7A-7C by removing the photoresist layer 27, and by performing an anneal process that induces outdiffusion of oxygen from the compositionally graded gate dielectric sublayer 12 into the active layer 20. The oxygen atoms diffuse from the compositionally graded gate dielectric sublayer 12 into a bottom surface portion 20B of the active layer 20. In this embodiment, the bottom surface portion 20B of the active layer 20 may have a compositional gradient such that the atomic concentration of oxygen atoms decreases with a vertical distance from the interface with the compositionally graded gate dielectric sublayer 12. In one embodiment, the bottom gate dielectric 110 comprises a compositionally-graded gate dielectric material (within the compositionally graded gate dielectric sublayer 12) in which an atomic concentration of oxygen atoms within the bottom gate dielectric 110 decreases with a vertical distance downward from an interface between the bottom gate dielectric 110 and the active layer 20, and the bottom surface portion 20B of the active layer 20 has a compositional gradient such that an atomic concentration of oxygen atoms decreases with a vertical distance upward from the interface with the bottom gate dielectric 110 at least to 20% of a vertical thickness t of the active layer 20.

Figure 22A:
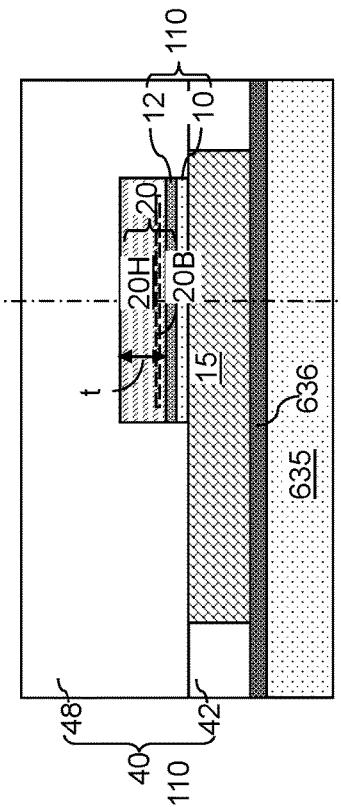
FIG. 22A is a top-down view of a region of the fourth exemplary structure after formation of an electrode-level dielectric layer according to the fourth embodiment of the present disclosure.
Figure 22B:
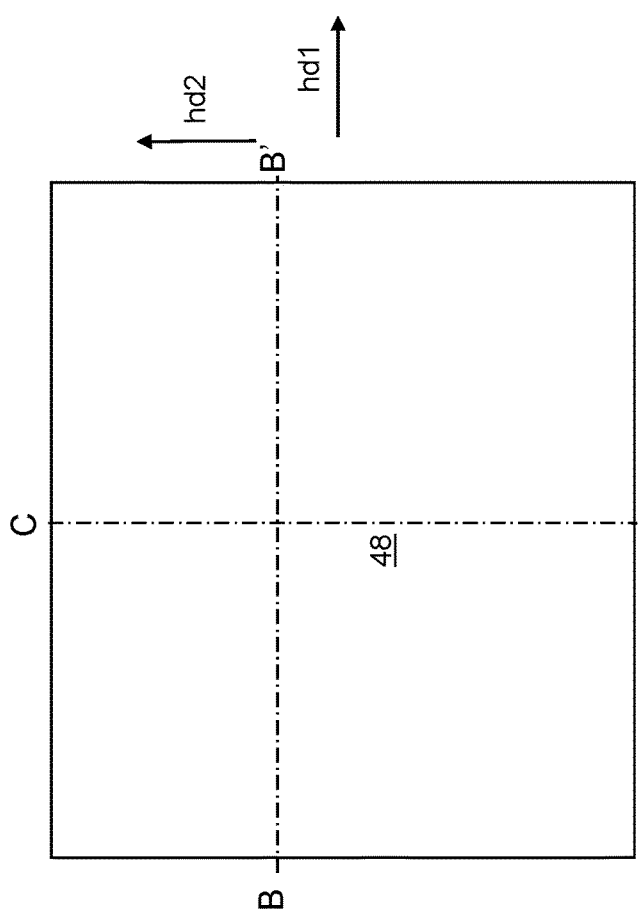
FIG. 22B is a vertical cross-sectional view of the fourth exemplary structure along the vertical plane B-B' of FIG. 22A.
Figure 22C:
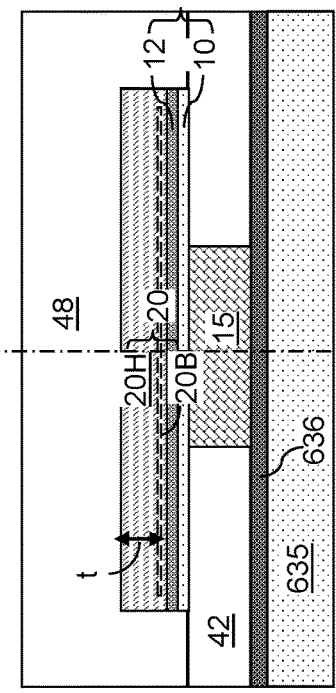
FIG. 22C is a vertical cross-sectional view of the fourth exemplary structure along the vertical plane C-C' of FIG. 22A.

Referring to FIGS. 22A-22C, the processing steps of FIGS. 9A-9C may be performed to form a dielectric layer 48. The dielectric material of the dielectric layer 48 may be planarized to provide a horizontal top surface. The set of the insulating layer 42 and the dielectric layer 48 is herein referred to as a thin-film-transistor-level (TFT-level) dielectric layer 40, i.e., a dielectric layer that is located at the level of thin film transistors.

Referring to FIGS. 23A-23C, the processing steps of FIGS. 10A-10C may be performed to form a source cavity 51, a drain cavity 59, and a backside electrode contact via cavity 19 through the dielectric layer 48.

Referring to FIGS. 24A-24C, the processing steps of FIGS. 11A-11C may be performed to form a source electrode 52, a drain electrode 56, and a backside electrode contact via structure 18. The active layer 20 and a set of electrode structures (52, 15, 56) may be formed within a TFT-level dielectric layer 40. Top surfaces of the source electrode 52, the drain electrode 56, and the bottom gate electrode contact structure 18 may be located within (i.e., may be co-planar with) a horizontal plane including a top surface of the TFT-level dielectric layer 40.

Referring to FIGS. 25A-25D, a fifth exemplary structure according to a fifth embodiment of the present disclosure may be derived from the fourth exemplary structure of FIGS. 21A-21C by forming a top gate dielectric 30 and a top gate electrode 35. Generally, a top gate dielectric layer and a top gate electrode material layer may be deposited over the active layer 20. The top gate dielectric layer may comprise any material that may be used for the continuous homogeneous gate dielectric sublayer 10C, and may have a thickness in a range from 1.5 nm to 12 nm, such as from 2 nm to 6 nm, although lesser and greater thicknesses may also be used. The top gate electrode material layer includes at least one conductive material, which may be any material that may be used for the bottom gate electrode 15. The thickness of the top gate electrode material layer may be in a range from 50 nm to 300 nm, such as from 100 nm to 200 nm, although lesser and greater thicknesses may also be used.

A photoresist layer (not shown) may be applied over the top gate electrode material layer, and may be lithographically patterned to form discrete photoresist material portions. The pattern in the photoresist material portions may be transferred through the top gate electrode material layer and the top gate dielectric layer by performing an anisotropic etch process, which may be selective to the material of the active layer 20. Each patterned portion of the top gate electrode material layer constitutes a top gate electrode 35. Each patterned portion of the top gate dielectric layer constitutes a top gate dielectric 30. The photoresist layer may be subsequently removed, for example, by ashing. The top gate electrode 35 straddles the active layer 20 along the second horizontal direction hd2. The top gate dielectric 30 contacts a portion of a top surface of the active layer 20, such as a top surface of the compositionally graded semiconducting metal oxide region 20G. The top gate electrode 35 overlies, and contacts, the top gate dielectric 30.

Referring to FIGS. 26A-26C, the processing steps of FIGS. 9A-9C may be performed to form a dielectric layer 48. The processing steps of FIGS. 10A-10C may be performed to form a source cavity 51, a drain cavity 59, and a backside electrode contact via cavity 19 through the dielectric layer 48.

Referring to FIGS. 27A-27C, the processing steps of FIGS. 11A-11C may be performed to form a source electrode 52, a drain electrode 56, and a backside electrode contact via structure 18. The active layer 20 and a set of electrode structures (52, 15, 35, 56) may be formed within a TFT-level dielectric layer 40. Top surfaces of the source electrode 52, the drain electrode 56, the top gate electrode 35, and the bottom gate electrode contact structure 18 may be located within (i.e., may be co-planar with) a horizontal plane including a top surface of the TFT-level dielectric layer 40.

Figure 28:
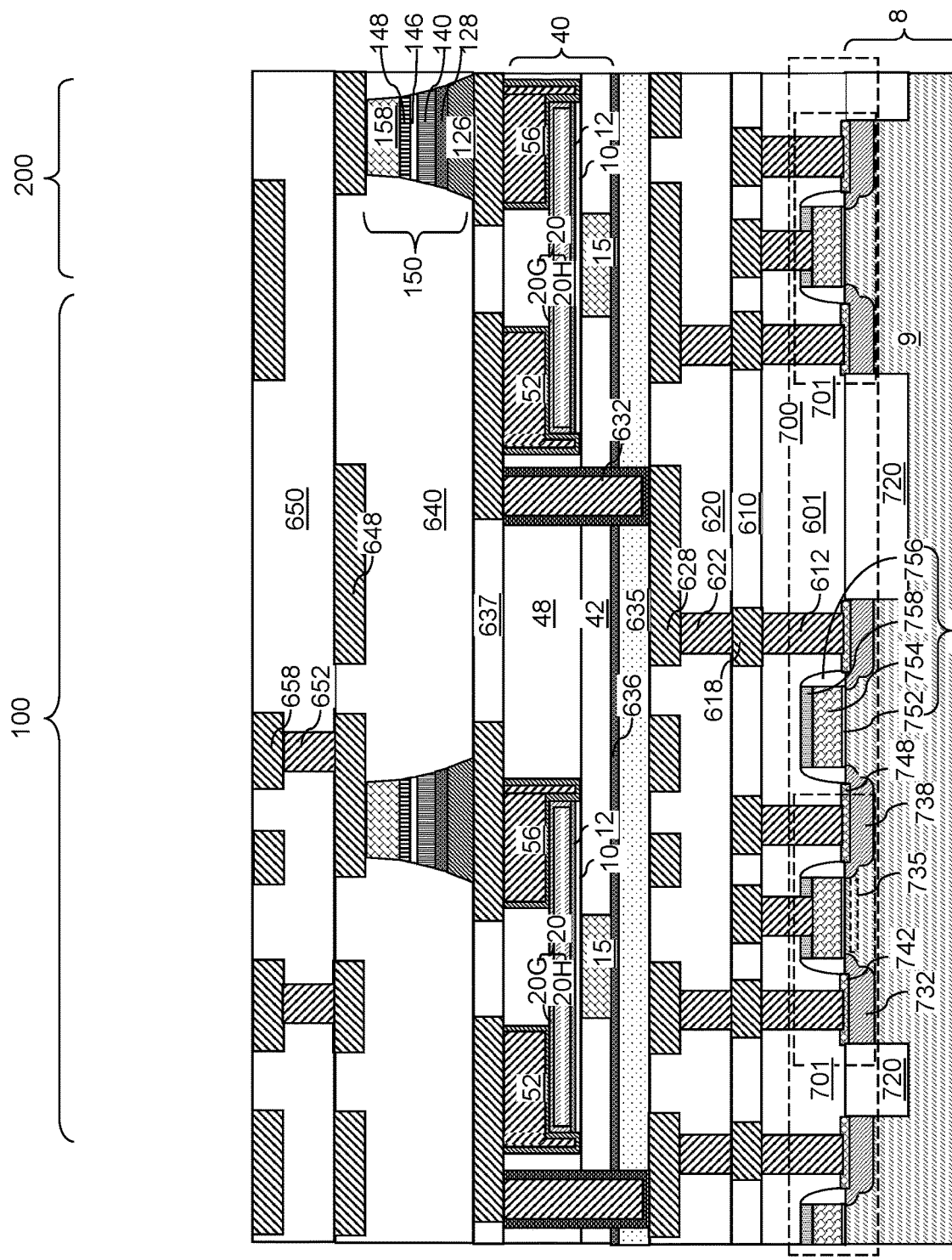
FIG. 28 is a vertical cross-sectional view of the exemplary structure after formation of memory cells according to an embodiment of the present disclosure.

Referring to FIG. 28, an exemplary structure is illustrated after formation of thin film transistors. The exemplary structure may be derived from the first exemplary structures illustrated in FIGS. 11A-11C, from the second exemplary structures illustrated in FIGS. 15A-15C, from the third exemplary structure illustrated in FIGS. 19A-20C, from the fourth exemplary structure illustrated in FIG. 24A-24C, or from the fifth exemplary structure illustrated in FIGS. 27A-27C. For example, second metal via structures 632 may be formed may be formed through the TFT-level dielectric layer 40 and the insulating spacer layer 635 on a respective one of the second metal line structures 628 concurrent with, before, or after, formation of the source electrodes 52, the drain electrodes 56, the optional top gate electrodes 35, and the backside electrode contact via structures 18.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 18) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may comprises a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 comprises a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

Figure 29:
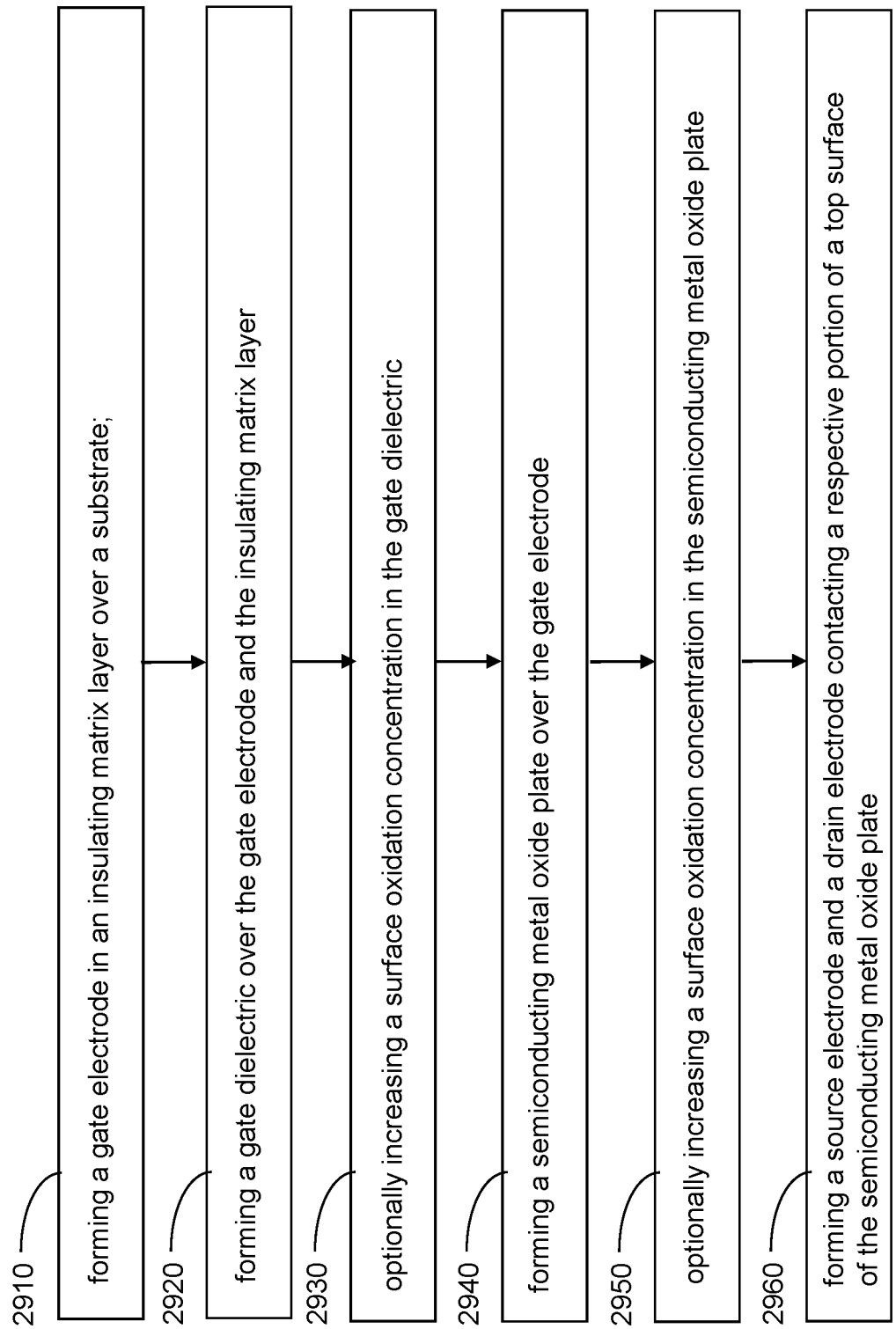
FIG. 29 is a flowchart that illustrates the general processing steps for manufacturing the semiconductor device of the present disclosure.

FIG. 29 is a flowchart that illustrates the general processing steps for manufacturing the semiconductor device of the present disclosure. Referring to step 2910 and FIGS. 1-4C, 12A-12C, 16A-16C, 20A-20C, 21A-21C, and 25A-25C, a gate electrode (such as a bottom gate electrode 15) may be formed in an insulating layer 42 over a substrate 8. Referring to step 2920 and FIGS. 5A-7C, 12A-12C, 16A-16C, 20A-20C, 21A-21C, and 25A-25C, a gate dielectric (such as a bottom gate dielectric (110 or 210)) may be formed over the gate electrode (such as the bottom gate electrode 15) and the insulating layer 42. Referring to an optional step 2930 and FIGS. 6A-6C, 12A-12C, 20A-20C, 21A-21C, and 25A-25C, a surface oxygen concentration in the gate dielectric (such as the bottom gate dielectric 110) may be increased by introducing oxygen atoms into a surface region of the gate dielectric (thereby forming a compositionally graded gate dielectric sublayer 12).

Referring to step 2940 and FIGS. 7A-8D, 12A-12C, 20A-20C, 21A-21C, and 25A-25C, an active layer 20 may be formed over the gate electrode (such as the bottom gate electrode 15). Referring to an optional step 2950 and FIGS. 8A-8D, 12A-12C, and 17A-17D, a surface oxygen concentration in the active layer 20 may be increased by introducing oxygen atoms into a surface region (such as a compositionally graded semiconducting metal oxide region 20G) of the active layer 20. Referring to step 2960 and FIGS. 8A-11C, 12A-15C, 16A-19C, 20A-20C, 22A-24C, and 26A-27C, a source electrode 52 and a drain electrode 56 contacting a respective portion of a top surface of the active layer 20 may be formed. Generally, at least one of steps 2930 and 2950 is performed. In one embodiment, step 2930 and 2950 are performed. In another embodiment, step 2930 is performed, and step 2950 is omitted. In yet another embodiment, step 2930 is omitted, and step 2950 is performed. Generally, a surface oxygen concentration in at least one of the gate dielectric (such as the bottom gate dielectric 110) and the active layer 20 may be increased by introducing oxygen atoms into a surface region of a respective one of the gate dielectric and the active layer 20.

Referring collectively to FIGS. 1-29 and according to various embodiments of the present disclosure, a semiconductor device comprising a thin film transistor located over a substrate 8 is provided. The thin film transistor comprises: an insulating layer 42 embedding a gate electrode (such as a bottom gate electrode 15) and overlying a substrate 8; a stack of a gate dielectric (such as a bottom gate dielectric 110) and an active layer 20 overlying the gate electrode, wherein the gate dielectric comprises a compositionally-graded gate dielectric material (comprising a compositionally graded gate dielectric sublayer 12) in which an atomic concentration of oxygen atoms within the gate dielectric (such as the bottom gate dielectric 110) decreases with a vertical distance downward from an interface between the gate dielectric and the active layer 20; and a source electrode 52 and a drain electrode 56 contacting a respective portion of a top surface of the active layer 20.

In one embodiment, a bottom surface portion 20B of the active layer 20 has a compositional gradient such that an atomic concentration of oxygen atoms decreases with a vertical distance upward from the interface at least to 20% of a vertical thickness t of the active layer 20. In one embodiment, the active layer 20 comprises, and/or consists essentially of, a compound semiconductor material including at least two metallic elements and oxygen. In one embodiment, the active layer 20 comprises an indium gallium zinc oxide material; and oxygen deficiency within the active layer 20 increases with the vertical distance upward from the interface at least to 20% of the vertical thickness t of the active layer 20.

In one embodiment, the compositionally-graded gate dielectric material comprises a compositionally-graded dielectric metal oxide material. In one embodiment, the compositionally-graded dielectric metal oxide material is selected from aluminum oxide, titanium oxide, yttrium oxide, zirconium oxide, lanthanum oxide, hafnium oxide, tantalum oxide, a compound thereof, and a layer stack thereof.

In one embodiment, a top surface portion of the active layer 20 has a compositional gradient such that an atomic concentration of oxygen atoms decreases with a vertical distance downward from a horizontal plane including a top surface of the active layer 20 at least to 20% of a vertical thickness t of the active layer 20.

In one embodiment, the active layer 20 comprises an indium gallium zinc oxide material; and oxygen deficiency within the active layer 20 increases with the vertical distance downward from the horizontal plane including the top surface of the active layer 20 at least to 20% of the vertical thickness t of the active layer 20. In one embodiment, sidewall surface portions of the active layer 20 (comprising vertically-extending regions of a compositionally graded semiconducting metal oxide region 20G) have a lateral compositional gradient such that an atomic concentration of oxygen atoms decreases with a lateral distance inward from a respective sidewall of the active layer 20.

In one embodiment, the semiconductor device comprises: a top gate dielectric 30 contacting a portion of a top surface of the active layer 20; and a top gate electrode 35 overlying the top gate dielectric 30.

According to another aspect of the present disclosure, a semiconductor device comprising a thin film transistor located over a substrate 8 is provided. The thin film transistor comprises: an insulating layer 42 embedding a gate electrode (such as a bottom gate electrode 15) and overlying a substrate 8; a stack of a gate dielectric (such as a bottom gate dielectric (110 or 220)) and an active layer 20 overlying the gate electrode (such as the bottom gate electrode 15), wherein a top surface portion (such as a compositionally graded semiconducting metal oxide region 20G) of the active layer 20 has a compositional gradient such that an atomic concentration of oxygen atoms decreases with a vertical distance downward from a horizontal plane including a top surface of the active layer 20 at least to 20% of a vertical thickness t of the active layer 20; and a source electrode 52 and a drain electrode 56 contacting a respective portion of a top surface of the active layer 20.

In one embodiment, the active layer 20 comprises an indium gallium zinc oxide material; and oxygen deficiency within the active layer 20 increases with the vertical distance downward from the horizontal plane including the top surface of the active layer 20 at least to 20% of the vertical thickness t of the active layer 20.

In one embodiment, sidewall surface portions of the active layer 20 (comprising vertically-extending regions of a compositionally graded semiconducting metal oxide region 20G) have a lateral compositional gradient such that an atomic concentration of oxygen atoms decreases with a lateral distance inward from a respective sidewall of the active layer 20.

In one embodiment, the semiconductor device comprises: a top gate dielectric 30 contacting a portion of a top surface of the active layer 20; and a top gate electrode 35 overlying the top gate dielectric 30.

In one embodiment, the gate dielectric (such as a bottom gate dielectric 110) comprises a compositionally-graded gate dielectric material (within a compositionally graded gate dielectric sublayer 12) in which an atomic concentration of oxygen atoms within the gate dielectric decreases with a vertical distance downward from an interface between the gate dielectric (such as the bottom gate dielectric 110) and the active layer 20; and a bottom surface portion 20B of the active layer 20 has a compositional gradient such that an atomic concentration of oxygen atoms decreases with a vertical distance upward from the interface at least to 20% of a vertical thickness t of the active layer 20.

The various embodiments of the present disclosure may be used to reduce outdiffusion of a metallic element such as indium from the active layer 20 by providing a surface layer of a stoichiometric semiconducting or dielectric metal oxide material. The density of oxygen vacancy in the stoichiometric semiconducting or dielectric metal oxide material is very low, and thus, the density of voids for facilitating diffusion of a metallic element is low within the surface layer of the stoichiometric semiconducting or dielectric metal oxide material. Blocking metal outdiffusion out of the active layer 20 prevents compositional changes within the active layer 20, and thus, may help maintain the device characteristics of the thin film transistor constant throughout the operational lifetime of the thin film transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device comprising a thin film transistor, the method comprising:
    forming a gate electrode in an insulating layer over a substrate;
    forming a gate dielectric over the gate electrode and the insulating layer;
    forming an active layer over the gate electrode;
    increasing a surface oxygen concentration in at least one of the gate dielectric and the active layer by introducing oxygen atoms into a surface region of a respective one of the gate dielectric and the active layer;
    forming an electrode-level dielectric layer having a flat top surface over the active layer and the insulating layer;
    forming a source cavity and a drain cavity through the electrode-level dielectric layer, wherein a first surface segment of a top surface of the insulating layer, first end portions of a pair of lengthwise sidewalls of the gate dielectric, an entirety of a first widthwise sidewall of the gate dielectric, first end portions of a pair of lengthwise sidewalls of the active layer, an entirety of a first one of a pair of widthwise sidewalls of the active layer, and a first end segment of a top surface of the active layer are physically exposed underneath the source cavity, and wherein a second surface segment of the top surface of the insulating layer, second end portions of the pair of lengthwise sidewalls of the gate dielectric, an entirety of a second widthwise sidewall of the gate dielectric, second end portions of the pair of lengthwise sidewalls of the active layer, an entirety of a second one of the pair of widthwise sidewalls of the active layer, and a second end segment of the top surface of the active layer are physically exposed underneath the drain cavity; and forming a source electrode and a drain electrode in the source cavity and in the drain cavity, respectively.

2. The method of claim 1, wherein the method comprises introducing oxygen atoms into top surface portion of the gate dielectric by performing a first thermal anneal process in an oxygen-containing ambient prior to formation of the active layer on the gate dielectric.

3. The method of claim 2, wherein the method comprises performing a second thermal anneal process after formation of the active layer.

4. The method of claim 3, wherein oxygen atoms diffuse from a top surface region of the gate dielectric into a bottom surface portion of the active layer to form a bottom surface region of the active layer in which an atomic concentration of oxygen atoms decreases with a vertical distance away from an interface with the gate dielectric.

5. The method of claim 2, wherein the first thermal anneal process forms within the gate dielectric a compositionally-graded gate dielectric material in which an atomic concentration of oxygen atoms within the gate dielectric decreases with a vertical distance downward from an interface between the gate dielectric and the active layer.

6. The method of claim 5, wherein the active layer is formed such that a bottom surface portion of the active layer has a compositional gradient such that an atomic concentration of oxygen atoms decreases with a vertical distance upward from the interface at least to 20% of a vertical thickness of the active layer.

7. The method of claim 1, wherein the method comprises introducing oxygen atoms into a top surface portion of the active layer by performing a surface oxidation process selected from:
 a plasma oxidation process using an oxygen-containing plasma; and
 a thermal anneal process in an oxygen-containing ambient.

8. The method of claim 7, wherein the top surface portion of the active layer has a compositional gradient after the surface oxidation process such that an atomic concentration of oxygen atoms decreases with a vertical distance downward from a horizontal plane including a top surface of the active layer at least to a depth located at 20% of a vertical thickness of the active layer.

9. A method of forming a semiconductor device comprising a thin film transistor, the method comprising:
 forming a gate electrode in an insulating layer over a substrate;
 forming a continuous gate dielectric layer over the gate electrode and the insulating layer;
 converting a top surface portion of the continuous gate dielectric layer into a continuous compositionally graded gate dielectric sublayer by performing a first oxidation process that introduces oxygen atoms into surface portions of the continuous gate dielectric layer, whereby a gate dielectric stack of a continuous homogeneous gate dielectric sublayer and a continuous compositionally graded gate dielectric sublayer;
 forming an active layer by depositing and patterning a semiconducting material over the gate electrode;
 forming a top gate dielectric and a top gate electrode over the gate electrode, the insulating layer, and the active layer by depositing and patterning a top gate dielectric layer and a top gate electrode material layer such that the top gate dielectric is formed directly on a portion of a top surface of the active layer, portions of a pair of lengthwise sidewalls of the active layer, a segment of a top surface of the gate electrode that does not have an areal overlap with the active layer, and a segment of a top surface of the insulating layer, wherein a pair of sidewalls of the top gate dielectric extends along a direction that is perpendicular to a separation direction between the source electrode and the drain electrode from the segment of the top surface of the gate electrode to the segment of a top surface of the insulating layer and over the active layer, and wherein the top gate electrode overlying the top gate dielectric, and wherein each lengthwise sidewall of the gate dielectric that is parallel to the separation direction is directly contacted by the top gate dielectric; and
 forming a source electrode and a drain electrode contacting a respective portion of a top surface of the active layer.

10. The method of claim 9, further comprising patterning the gate dielectric stack into a gate dielectric by transferring a pattern in the active layer through the gate dielectric stack.

11. The method of claim 9, wherein an atomic concentration of oxygen atoms decreases gradually within the continuous compositionally graded gate dielectric sublayer with a downward distance from a horizontal plane including a top surface of the continuous compositionally graded gate dielectric sublayer after the first oxidation process.

12. The method of claim 9, wherein the first surface oxidation process is selected from:
 a plasma oxidation process using an oxygen-containing plasma; and
 a thermal anneal process in an oxygen-containing ambient.

13. The method of claim 9, further comprising performing a second oxidation process that introduces additional oxygen atoms into surface portions of the active layer, whereby surface portions of the active layer are converted into a compositionally graded semiconducting metal oxide region.

14. The method of claim 13, wherein the second oxidation process forms a compositional gradient in a bottom surface portion of the active layer by diffusion a subset of oxygen atoms in a remaining portion of the continuous compositionally graded gate dielectric sublayer such that an atomic concentration of oxygen in the bottom surface portion of the active layer decreases with a vertical distance away from an interface with the remaining portion of the continuous compositionally graded gate dielectric sublayer.

15. The method of claim 13, wherein the compositionally graded semiconducting metal oxide region comprises:
 a horizontally-extending portion that overlies a homogeneous semiconducting metal oxide region of the active layer; and four vertically-extending portions located beneath a respective sidewall of the active layer.

16. A method of forming a semiconductor device comprising a thin film transistor, the method comprising:
forming a gate electrode in an insulating layer over a substrate;
forming a gate dielectric over the gate electrode and the insulating layer;
forming an active layer over the gate electrode;
increasing a surface oxygen concentration in the active layer by introducing oxygen atoms into a surface region of the active layer by performing an oxidation process;
forming a top gate dielectric and a top gate electrode over the gate electrode, the insulating layer, and the active layer by depositing, and patterning by transfer of a same pattern though, a top gate dielectric layer and a top gate electrode material layer such that the top gate dielectric is formed directly on a portion of a top surface of the active layer, portions of a pair of lengthwise sidewalls of the active layer, a segment of a top surface of the gate electrode that does not have an areal overlap with the active layer, and a segment of a top surface of the insulating layer, wherein a pair of sidewalls of the top gate dielectric extends along a direction that is perpendicular to a separation direction between the source electrode and the drain electrode from the segment of the top surface of the gate electrode to the segment of a top surface of the insulating layer and over the active layer, and wherein each sidewall of the top gate electrode has a respective bottom edge that coincides with a respective top edge of the top gate dielectric; and
forming a source electrode and a drain electrode contacting a respective portion of a top surface of the active layer.

17. The method of claim 16, wherein:
the oxidation process forms a compositionally graded semiconducting metal oxide region in the surface region the active layer; and
the compositionally graded semiconducting metal oxide region laterally encloses a homogeneous semiconducting metal oxide region.

18. The method of claim 16, further comprising:
forming a continuous gate dielectric layer over the gate electrode and the insulating layer;
converting a top surface portion of the continuous gate dielectric layer into a continuous compositionally graded gate dielectric sublayer by performing another oxidation process that introduces oxygen atoms into surface portions of the continuous gate dielectric layer, whereby a gate dielectric stack of a continuous homogeneous gate dielectric sublayer and a continuous compositionally graded gate dielectric sublayer, and wherein the active layer is formed over the gate dielectric stack; and
patterning the gate dielectric stack into the gate dielectric by removing portions of the gate dielectric stack that are not covered by the active layer.

19. The method of claim 18, wherein the oxidation process forms a compositional gradient in a bottom surface portion of the active layer by diffusion a subset of oxygen atoms in a remaining portion of the continuous compositionally graded gate dielectric sublayer such that an atomic concentration of oxygen in the bottom surface portion of the active layer decreases with a vertical distance away from an interface with the remaining portion of the continuous compositionally graded gate dielectric sublayer.

20. The method of claim 16, further comprising forming a top gate structure including a top gate dielectric and a top gate electrode over a middle portion of a top surface of the surface region of the active layer.

* * * * *